US008904316B2

(12) United States Patent  
Solak et al.

(10) Patent No.: US 8,904,316 B2
(45) Date of Patent: Dec. 2, 2014

(54) METHOD AND APPARATUS FOR PRINTING HIGH-RESOLUTION TWO-DIMENSIONAL PERIODIC PATTERNS

(75) Inventors: Harun H. Solak, Brugg (CH); Francis Clube, Hausen (CH)

(73) Assignee: Eulitha A.G., Villigen/PSI (CH)

( * ) Notice: Subject to any disclaimer, the term of this patent is extended or adjusted under 35 U.S.C. 154(b) by 0 days.

(21) Appl. No.: 13/885,808

(22) PCT Filed: Nov. 16, 2011

(86) PCT No.: PCT/IB2011/055133
§ 371 (c)(1),
(2), (4) Date: Jul. 2, 2013

(87) PCT Pub. No.: WO2012/066489
PCT Pub. Date: May 24, 2012

(65) Prior Publication Data
US 2013/0329203 A1    Dec. 12, 2013

Related U.S. Application Data

(60) Provisional application No. 61/425,774, filed on Dec. 22, 2010, provisional application No. 61/414,039, filed on Nov. 16, 2010.

(51) Int. Cl.
*G06F 17/50* (2006.01)
*G03F 7/20* (2006.01)
*G03F 1/28* (2012.01)

(52) U.S. Cl.
CPC ........ *G03F 7/70058* (2013.01); *G03F 7/70408* (2013.01); *G03F 1/28* (2013.01)
USPC ................... 716/54; 716/51; 716/53; 716/55; 716/56; 430/5; 430/30

(58) Field of Classification Search
USPC ..................... 716/50–56; 430/5, 30
See application file for complete search history.

(56) References Cited

U.S. PATENT DOCUMENTS 4,360,586 A    11/1982 Flanders et al.
7,354,682 B1 *  4/2008 Capodieci ................. 430/5
(Continued)

OTHER PUBLICATIONS

Solak Harun et al: "Achromatic spatial frequency multiplication: A method for production of nanometer-scale periodic structures", Journal of Vacuum Science and Technology: Part B, AVS / AIP, Melville, New York, NY, US, vol. 23, No. 6, Dec. 1, 2005, pp. 2705-2710, XP012080238, ISSN: 1071-1023.

*Primary Examiner* — Nha Nguyen
(74) *Attorney, Agent, or Firm* — Laurence A. Greenberg; Werner H. Stemer; Ralph E. Locher

(57) ABSTRACT

A method for printing a periodic pattern having a first symmetry and a first period into a photosensitive layer. The method includes providing a mask bearing a pattern of at least two overlapping sub-patterns which have a second symmetry and a second period, the features of each sub-pattern being formed in a transmissive material, providing a substrate bearing the layer, arranging the mask with a separation from the substrate, providing light having a central wavelength for illuminating the mask to generate a light-field in which light of the central wavelength forms a range of intensity distributions between Talbot planes, illuminating said mask pattern with said light while maintaining the separation or changing it by a distance whereby the photosensitive layer is exposed to an average of the range of intensity distributions, wherein the light transmitted by each sub-pattern is shifted in phase relative to that transmitted by another sub-pattern.

12 Claims, 23 Drawing Sheets

(56) References Cited

U.S. PATENT DOCUMENTS

| | | |
|---|---|---|
| 2008/0180800 A1 | 7/2008 | Bakker |
| 2008/0186579 A1 | 8/2008 | Solak |
| 2010/0003605 A1* | 1/2010 | Gil et al. .......................... 430/1 |

* cited by examiner

METHOD AND APPARATUS FOR PRINTING HIGH-RESOLUTION TWO-DIMENSIONAL PERIODIC PATTERNS

BACKGROUND OF THE INVENTION

Field of the Invention

This invention relates generally to the field of photolithography as employed for the fabrication of micro- and nano-structures, and it relates particularly to the field of photolithography based on the Talbot effect, or self-imaging.

Lithographic fabrication enables the formation of micro- and nano-patterns on surfaces. Photolithographic techniques achieve this by exposing a photosensitive surface to a light-field with an intensity distribution corresponding to the desired pattern. The photosensitive surface is usually a thin layer of a sensitive material, such as photoresist, which is coated either directly on a substrate surface or indirectly over intermediate layers of other materials. Chemical or physical changes that occur in the photosensitive layer as a result of the exposure are used in subsequent processes to obtain a desired pattern in the material of the substrate or in an intermediate layer of another material. In the most commonly used photolithographic technique an image of a pattern defined in a mask is projected onto the substrate surface using an optical system. The masks generally employed in such conventional systems are amplitude masks in which the pattern features are defined as open areas in a layer of an opaque material, usually chrome, on a transparent substrate. Phase-shift masks (PSMs) are alternatively used in which the pattern features are defined using a certain thickness of a material or a depth of recess into a material, so that the light propagating through those features is shifted in phase with respect to other propagating light, which then mutually interfere in the image plane to form the desired pattern. In the case of PSMs employed in projection, contact, proximity or conventional Talbot lithography, the mask is designed by considering the interference between all the diffraction orders transmitted by the mask. In the case of one-dimensional pattern, a PSM can reduce the minimum printable period by a factor of two with respect to an amplitude mask. This is mainly achieved by suppressing the 0th-order diffracted beam, thereby eliminating the intensity modulation produced by its interference with the 1st-order diffracted beams.

For many applications patterns are required that comprise a cell of pattern features that repeats in one or two dimensions, that is, periodic patterns. A specialized photolithographic technique for transferring such patterns from masks onto substrates is based on the Talbot effect. When a periodic pattern defined in a mask is illuminated with a collimated beam of monochromatic light, diffraction orders in the transmitted light-field reconstruct "self-images" of the pattern at regular distances from the mask in so-called Talbot planes. The separation of the self-images, S, which is known as the Talbot distance, is related to the illumination wavelength, $\lambda$, and period of the pattern, p, by $$S \approx 2p^2/\lambda \qquad \text{equ. (1)}$$

Whereas, this formula has good accuracy when $p \gg \lambda$ (i.e. when the light is diffracted at relatively small angles), it approximates less well as the magnitude of p approaches $\lambda$. Locating a photoresist-coated substrate at one of these planes results in the mask pattern being printed into the photoresist (see, for example, C. Zanke, et al., "Large area patterning for photonic crystals via coherent diffraction lithography", J. Vac. Sci. Technol. B 22, 3352 (2004)). Furthermore, at intermediate distances between the self-image planes, Talbot sub-images are formed that have higher spatial frequencies than the pattern in the mask, which may be printed by placing a photoresist-coated substrate at one of these fractional Talbot planes. The printed results achieved using these techniques are improved when the duty cycle of the mask pattern (i.e. the dimension of the features as a fraction of the feature period) is selected to produce a high contrast of intensity distribution in the Talbot or fractional Talbot plane (see U.S. Pat. No. 4,360,586). It is also known in the prior art that the contrast of the Talbot images can be further enhanced by fabricating the periodic patterns in the mask using phase shifting materials. Photolithography using Talbot imaging is especially advantageous for printing high-resolution periodic patterns in view of the high cost of conventional, projection-type photolithographic systems for such patterns.

A major shortcoming of the Talbot technique, however, is that the intensity distributions of the self-images and sub-images are very sensitive to the distance from the mask, that is, they have a very narrow depth of field. This means that the substrate needs to be positioned very accurately with respect to the mask in order to correctly print the pattern. This becomes increasingly more difficult as the grating period is reduced because the depths of field of the self-images and sub-images depend on the square of the pattern period. Furthermore, if the pattern needs to be printed onto a substrate surface that is not very flat or if there are topographical structures on its surface, or the pattern needs to be printed into a thick layer of photoresist, it may be impossible to achieve the desired result.

Achromatic Talbot lithography has recently been introduced as a new method for printing high-resolution periodic patterns in a cost effective way (see H. H. Solak, et al., "Achromatic Spatial Frequency Multiplication: A Method for Production of Nanometer-Scale Periodic Structures", J. Vac. Sci. Technol., 23, pp. 2705-2710 (2005), and U.S. Pat. Appl. no. 2008/0186579). It offers two significant advantages for lithographic applications: firstly, it overcomes the depth-of-field problem encountered using the classical Talbot method; and, secondly, for many pattern types it performs a spatial-frequency multiplication, that is, it increases the resolution of the printed features with respect to that of the pattern in the mask. In achromatic Talbot lithography (ATL) the mask is illuminated with a collimated beam from a light source with a broad spectral bandwidth, and beyond a certain distance from the mask the transmitted light-field forms a so-called stationary image whose intensity distribution is invariant to further increase in distance. The minimum distance, $d_{min}$, from the mask at which this occurs is related to the period of the pattern, p, in the mask and to the spectral bandwidth of the illumination, $\Delta\lambda$, by:

$$d_{min} \approx 2p^2/\Delta\lambda \qquad \text{equ. (2)}$$

Beyond this distance, the Talbot image planes for the different wavelengths are distributed in a continuous manner with increasing distance from the mask, which generates the stationary image. Thus, by placing a photoresist-coated substrate in this region exposes the substrate to the entire range of transverse intensity distributions formed between successive Talbot planes for a particular wavelength. The pattern printed onto the substrate is therefore an average, or integration, of this range of transversal intensity distributions, which is substantially insensitive to longitudinal displacement of the substrate with respect to the mask. The technique therefore enables a much larger depth of field than with standard Talbot imaging, and a much larger depth of field than with conventional projection, proximity or contact printing.

The intensity distribution in an ATL image from a particular mask pattern may be determined using modelling software that simulates the propagation of electromagnetic waves through and after the mask. Such simulation tools may be used to optimize the design of the pattern in the mask for obtaining a particular printed pattern at the substrate surface.

The ATL method has been developed primarily to print periodic patterns that comprise a unit cell that repeats with a constant period in at least one direction. The technique may, however, also be successfully applied to patterns whose period spatially varies in a sufficiently "slow", gradual way across the mask such that the diffraction orders that form a particular part of the stationary image are generated by a part of the mask in which the period is substantially constant. Such patterns may be described as being quasi-periodic.

A drawback of ATL is that it requires a light source with a significant spectral bandwidth in order that the separation required between the mask and substrate is not disadvantageously large. The angular divergence of the different diffracted orders propagating from the mask produces spatial offsets between the different orders at the substrate surface resulting in imperfect image reconstruction at the pattern edges, which becomes worse with increasing separation. Fresnel diffraction at the edges of the diffracted orders also degrades the edges of the printed pattern, and this likewise gets worse with increasing separation. For these reasons laser sources, which have relatively small spectral bandwidth, are in most cases unsuitable for ATL.

A difficulty with applying non-laser sources such as arc lamps or light emitting diodes to ATL is obtaining the combination of high power in the exposure beam (for ensuring high throughput in a production process) and good beam collimation (for ensuring high-contrast imaging and minimizing loss of feature resolution). Obtaining good collimation from these sources requires spatial filtering of the output beam which generally results in a large loss of power.

The advantages of the ATL technique may be obtained using a different but related technique that is disclosed in U.S. Pat. Appl. no. 2008/0186579. In this scheme, the periodic pattern in the mask is illuminated by a collimated beam of monochromatic light and during exposure the distance of the substrate from the mask is varied over a range corresponding to an integer multiple of the separation between successive Talbot image planes in order that an average of the intensity distributions between Talbot planes is printed on the substrate. The smallest displacement that may be employed is therefore equal to the separation of successive Talbot planes (when integer=1). With this displacement during exposure, the pattern printed on the substrate is substantially the same as that printed using the ATL technique. It is disclosed that the displacement may be performed either continuously or in a discrete way by exposing the substrate at multiple discrete positions over the range. Using the continuous displacement, the speed of displacement is necessarily constant in order that the desired average of the transversal intensity distributions is obtained, and using the discrete, or stepped, displacement, the exposure dose at each discrete position should necessarily be the same for the same reason. The general technique may be referred to as displacement Talbot lithography (DTL)

The average intensity distributions generated at the substrate using the ATL and DTL techniques are essentially equivalent, and both enable a large depth of field and spatial-frequency multiplication for the printed pattern. The DTL scheme can be used with much smaller separations of the substrate and mask than the ATL scheme. This reduces the degradation of the pattern edges and allows more efficient utilization of the output from the light source because of the less stringent requirement on collimation. Further, the DTL technique enables the use of laser sources, which may be preferred for production processes. The light from such sources can be formed into well-collimated beams with negligible loss of power, so minimize loss of feature resolution and maximize image contrast.

The structure of the patterns printed using DTL from a particular mask pattern may also be theoretically determined using simulation software.

The DTL technique described in U.S. Pat. Appl. no. 2008/0186579 requires that the longitudinal displacement of the substrate relative to the mask during exposure accurately corresponds to an integer multiple of the Talbot distance. When the displacement is exactly an integer multiple, the average intensity distribution exposing the substrate is independent of the initial separation of the substrate and mask, and so produces a uniform exposure of the pattern features on the substrate even if the mask and substrate are not accurately flat and parallel. If, on the other hand, the displacement is not an exact integer multiple of the Talbot distance because of, for example, mechanical hysteresis or limited stepping resolution of a displacement actuator, or because of inexact synchronization between the duration of the exposure by the illumination system and the displacement of the substrate, then the average intensity distribution depends on the initial separation. In this case, if the mask and substrate are not accurately flat and parallel, then a spatial variation of feature size is introduced into the printed pattern; or, if the mask and substrate are accurately flat and parallel but their separation is different for different substrates, then the size of the printed features varies from substrate to substrate; both of which may be problems for certain applications. These variations of feature size may be reduced by longitudinally displacing the substrate by a large number of Talbot distances relative to the mask, but this can introduce other problems such as degradation of the feature resolution (if the illumination beam is not well collimated), distortion of the feature shape (if the direction of displacement is not accurately longitudinal), degradation of the pattern edges (if the gap becomes too large), and disadvantageously requires larger travel range in the mechanical system.

Unpublished U.S. application Ser. No. 12/903,389 teaches a modification of the DTL technique in order to overcome this limitation, so as to enable periodic or quasi-periodic patterns to be printed uniformly and reproducibly without the requirement that the longitudinal displacement of the substrate relative to the mask during exposure accurately corresponds to an integer multiple of the Talbot distance.

Unpublished U.S. application Ser. No. 12/706,081 teaches an enhancement of the ATL and DTL techniques in which the periodic or quasi-periodic pattern of features in the mask is instead illuminated with a beam having an angular distribution of illumination, whereby each of the angular components of the illuminating beam exposes the photoresist to the range of lateral intensity distributions that occur between successive Talbot image planes, so that the resultant intensity distribution exposing the photoresist corresponds to a convolution of the angular distribution of the illuminating beam with the average intensity distribution produced using collimated illumination. This method allows a greater flexibility for the shapes of the printed features and also enables a multiplication of the number of printed features within each unit cell of the periodic pattern and a reduction of the pattern period in at least one direction. The latter, however, requires a relatively small duty cycle for the transparent features in the mask, which can be undesirable if the mask needs to have high transmission in order to achieve a short printing time for a manufacturing process.

The above-identified unpublished U.S. patent applications are hereby incorporated by reference.

A limitation of the ATL and DTL techniques described in the prior art and in the modifications thereof described in the above-identified unpublished U.S. patent applications is the smallest period of two-dimensional pattern that can be printed for a particular array type using illumination whose spectral bandwidth is centred on a particular wavelength. In the case of a periodic pattern whose features are arranged on a hexagonal grid, the smallest nearest-neighbour distance (i.e. the distance between the centres of neighbouring features), $a_{min}$, that can be printed with the DTL technique using light with wavelength, $\lambda$, is given by $a_{min}=2\lambda/\sqrt{3}=1.15\lambda$. In the case of a pattern with features arranged on a square grid, the smallest period, $p_{min}$, that can be printed is given by $p_{min}=\lambda/\sqrt{2}=0.71\lambda$.

A further limitation of the ATL and DTL techniques of the prior art is the range, or variety, of array and pattern types that can printed using collimated illumination of the mask.

BRIEF SUMMARY OF THE INVENTION

It is therefore a first object of the present invention to provide a method and apparatus for printing a two-dimensional periodic or quasi-periodic pattern of features from a pattern in a mask that is based on the techniques of ATL and DTL and enables the period of the pattern printed using illumination having a spectral bandwidth centred on a given wavelength to be smaller than that possible using said prior-art techniques.

It is a second object of the invention to provide a method that additionally enables a relatively high transparency of the mask in order to that the time required to print the pattern of features is relatively short.

It is a third objective of the present invention to provide a method and apparatus for printing a two-dimensional periodic or quasi-periodic pattern of features from a pattern in a mask that is based on the techniques of ATL and DTL and that enables an array type to be printed which would not be possible using said prior-art techniques, for example, a honeycomb array or a continuous grid, or mesh-like, structure.

It is a fourth objective of the present invention to provide a method and apparatus for printing a two-dimensional periodic or quasi-periodic pattern of features from a pattern in a mask that is based on the techniques of ATL and DTL and that enables an array type, such as a hexagonal array, to be printed from a different array type, such as a honeycomb array, which would not be possible using said prior-art techniques, thereby conferring certain advantages such as facilitating the fabrication of the mask.

According to a first aspect of the present invention a method is provided for printing a desired two-dimensional periodic pattern of features having a first lattice symmetry and a first nearest-neighbour distance into a photosensitive layer that includes:

a) providing a mask bearing a mask pattern composed of at least two overlapping periodic sub-patterns of features which each have a second lattice symmetry and a second nearest-neighbour distance, the features of each sub-pattern being formed in or on at least one transmissive material;
b) providing a substrate bearing the photosensitive layer;
c) arranging the mask substantially parallel to and with a separation from the substrate;
d) providing substantially collimated light having a central wavelength and a spectral bandwidth for illuminating the mask pattern to generate a transmitted light-field in which light of the central wavelength forms a range of transversal intensity distributions between Talbot planes;
d) illuminating said mask pattern with said light whilst one of maintaining the separation and changing it by a displacement distance whereby the photosensitive layer is exposed to substantially an average of the range of transversal intensity distributions, which prints the desired pattern;
wherein the separation is either arranged according to the spectral bandwidth and the second nearest-neighbour distance and maintained during the illumination or is changed during the illumination by a displacement distance that is related to the central wavelength and the second nearest-neighbour distance; wherein, the sub-patterns are formed so that the light transmitted by each sub-pattern is shifted in phase relative to that transmitted by at least one other sub-pattern; and wherein the second nearest-neighbour distance is selected in relation to the central wavelength so that first diffraction orders are formed in the transmitted light-field.

Since the optical principles of the ATL and DTL techniques are very different from those of projection and proximity optical systems, the use of PSMs with ATL or DTL lead to unexpected and/or advantageous results. For example, if a chrome-less PSM of a linear grating and an amplitude mask of a grating with the same period are imaged using a conventional projection system then the grating printed with the PSM has half the period of that printed with the amplitude mask. Using DTL or ATL, on the other hand, the period of the patterns printed with the PSM and amplitude masks are the same, both being half that of the grating in the mask. Generally, employing PSMs of two-dimensional patterns with ATL or DTL requires different design and optimization methodologies and enables high-resolution patterns to be printed that have advantageous and surprising characteristics in comparison with the patterns printed using standard photolithographic systems.

BRIEF DESCRIPTION OF THE SEVERAL VIEWS OF THE DRAWING

Preferred examples of the present invention are hereinafter described with reference to the following figures:

FIG. 4b shows the intensity variation in the x direction across the distribution of FIG. 4a.

FIG. 5b shows the intensity variation in the x direction across the distribution of FIG. 5a.

FIG. 7b shows the intensity variation in the x direction across the distribution of FIG. 7a.

FIG. 8b shows the intensity variation in the x direction across the distribution of FIG. 8a.

FIG. 10b shows the intensity variation in the x direction across the distribution of FIG. 10a.

FIG. 11b shows the intensity variation in the x direction across the distribution of FIG. 11a.

FIG. 12b shows the intensity variation in the x direction across the distribution of FIG. 12a.

FIG. 14b shows the intensity variation in the x direction across the distribution of FIG. 14a.

FIG. 17b shows the intensity variation in the x direction across the distribution of FIG. 17a.

FIG. 19b shows the intensity variation in the x direction across the distribution of FIG. 19a.

FIG. 22b shows the intensity variation in the x direction across the distribution of FIG. 22a.

FIG. 24b shows the intensity variation in the x direction across the distribution of FIG. 24a.

FIG. 26b shows the intensity variation in the x direction across the distribution of FIG. 26a.

FIG. 29b shows an intensity variation in the x direction across the intensity peaks of FIG. 29a.

FIG. 30b shows an intensity variation in the x direction across the intensity peaks of FIG. 30a.

FIG. 31b shows an intensity variation in the x direction across the intensity peaks of FIG. 31a.

FIG. 33b shows an intensity variation in the x direction across the intensity peaks of FIG. 33a.

FIG. 35b shows the intensity variation in the x direction across the intensity peaks of FIG. 35a.

DESCRIPTION OF THE INVENTION

Figure 1:
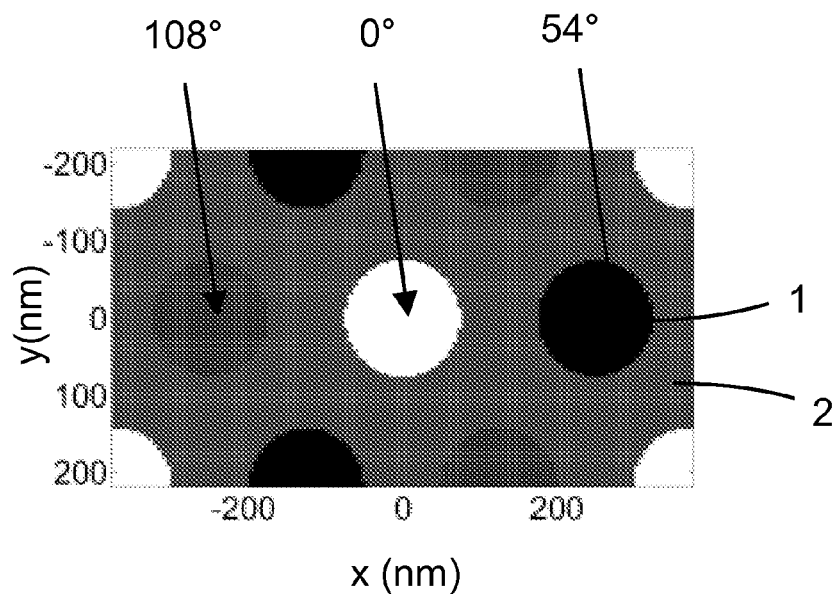
FIG. 1 shows a design of a hexagonal pattern of features in a phase-shift mask employed in a first embodiment.
Figure 2:
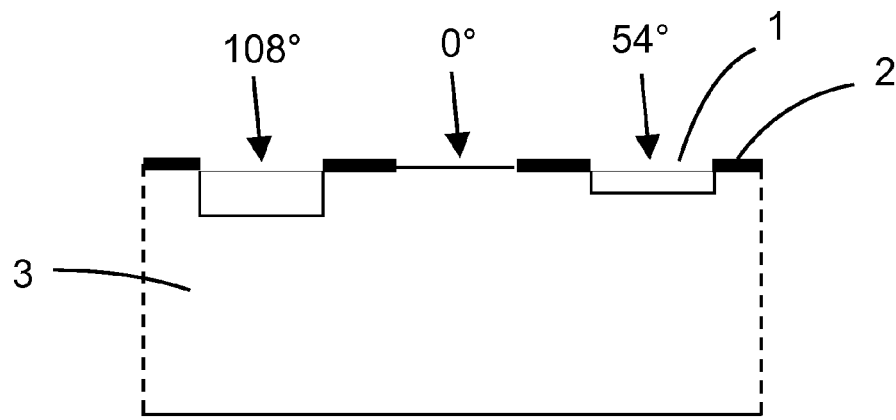
FIG. 2 shows the cross-section of the phase-shift mask of the first embodiment.
Figure 3:
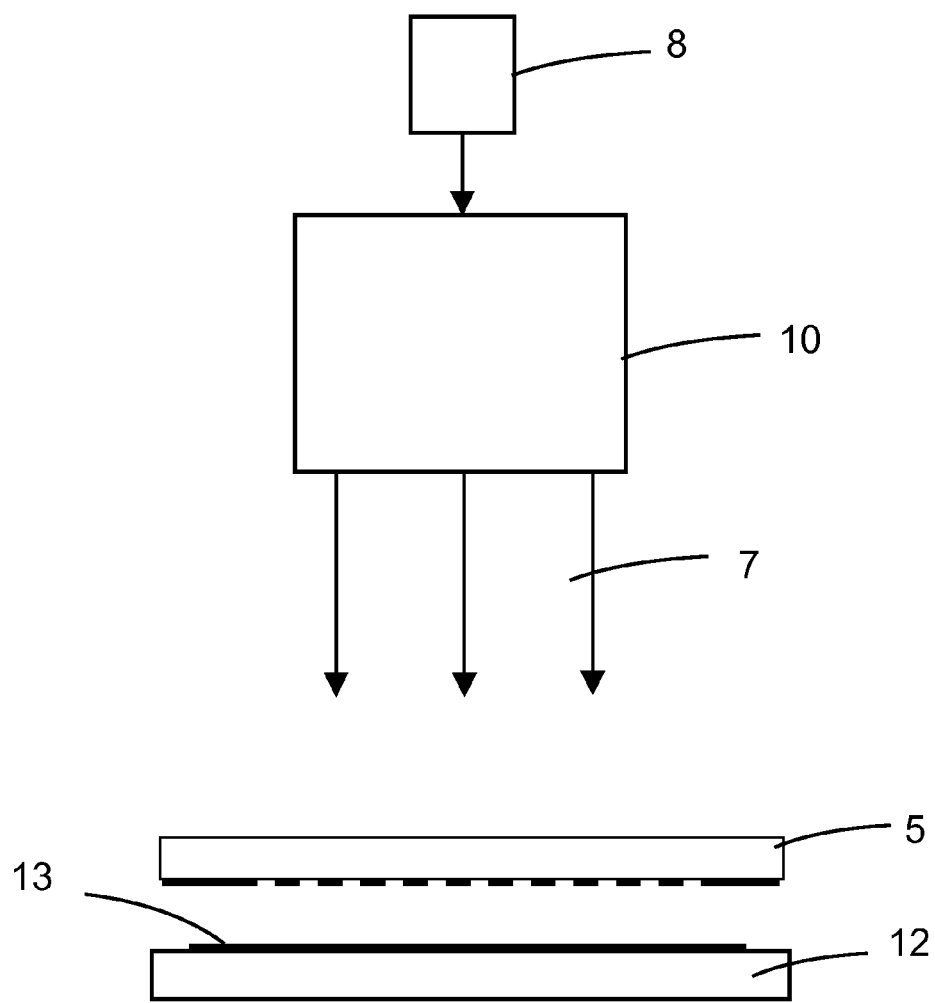
FIG. 3 shows an exposure system of the first embodiment.

In a first embodiment of the present invention, with reference to FIGS. 1 and 2, a composite pattern in a mask comprises an array of holes 1 with diameter 150 nm arranged on a hexagonal grid with a nearest-neighbour distance, a=250 nm, that has been formed in an opaque layer of chrome 2 on a fused silica substrate 3. The pattern is composed of three overlapping and mutually offset sub-patterns of holes, the holes within each sub-pattern being arranged on a hexagonal grid with a nearest-neighbour distance, b=√3a=433 nm. FIG. 1 depicts a repeating cell of the composite pattern, which is repeated in a two-dimensional array of the repeating cells over a large area of the total mask pattern. The surface of the fused silica substrate within the holes of the second sub-pattern has been substantially uniformly etched to a depth of 116 nm and, within the holes of the third sub-pattern, has been etched to a larger depth of 232 nm, so that the resulting cross-sectional profile of the holes in the three sub-patterns is as shown in FIG. 2. The mask has been fabricated using standard mask-making technology as employed by the microelectronics industry for fabricating phase-shift masks. A possible fabrication strategy, the details of which would be known to a person skilled in the art, would comprise first defining and opening all the holes in the chrome layer using an e-beam lithography process; re-coating the mask with resist and performing a further e-beam writing step to clear the resist over the holes of the second sub-pattern, and subsequently etching the holes to the required depth; followed by a similar re-coating, resist clearing and etching sequence for the holes of the third sub-pattern. With reference to FIG. 3, this mask 5 is introduced into an exposure system designed for printing patterns onto a substrate 12 that is coated on its upper surface with a layer of photoresist 13, according to the technique of DTL. The mask 5 is illuminated at normal incidence by a beam of monochromatic light 7 with wavelength 364 nm derived from an argon ion laser 8 that has been collimated by an optical system 10. The optical system 10 includes a circular polarizer for converting the plane-polarized beam from the laser 8 into one that is circularly polarized. This is important for ensuring that asymmetry is not introduced into the features of the high-resolution two-dimensional array printed from the mask 5 of this embodiment. With these illumination conditions and the selected hole depths (and with a refractive index of 1.47 for the fused silica), the light transmitted by the holes of the second and third sub-patterns is shifted in phase by 54° and 108° respectively relative to that transmitted by the first sub-pattern. If the holes of the composite pattern in the mask 5 were simply formed in a layer of chrome on a substrate without the different hole depths between sub-patterns, i.e. according to the teaching of the prior art, then the sub-wavelength nearest-neighbour distance of the holes in the composite pattern would only allow the 0th diffraction order to propagate, and thus prevent a periodic pattern from being printed onto the substrate 12. Using instead the mask 5 with the phase-shifting second and third sub-patterns, however, allows six 1st diffraction orders to propagate which interfere with the 0th-order beam to generate a series of Talbot planes that are longitudinally separated by a Talbot distance. The polar angular component, $\theta_1$, of the 1st-order beams is related to the nearest-neighbour distance, b, of the hexagonal sub-pattern arrays by $$\sin \theta_1 = 2\lambda/(\sqrt{3}b) \qquad \text{equ. (3)}$$

The Talbot distance, $L_T$, separating the self-image planes in the resulting light-field may be calculated from the polar angle of the 1st diffraction orders using $$L_T = \lambda/(\cos \theta_0 - \cos \theta_1) \qquad \text{equ. (4)}$$

where $\theta_0$ is the polar angle of the 0th-order beam. With normal-incidence illumination of the mask $\theta_0 = 0$.

Exposing the photoresist-coated substrate 12 to this light-field using the DTL technique, by longitudinally displacing the substrate 12 with respect to the mask 5 during the exposure by a distance of at least the Talbot distance, therefore results in a periodic intensity distribution being printed into the photoresist layer 13. Most preferably the displacement of the substrate relative to the mask during the exposure is performed according to the teaching of Ser. No. 12/903,389. Specifically, it is most preferable that the photoresist-coated substrate is longitudinally displaced relative to the mask during the exposure with a varying speed so that mask is illuminated by an energy density per incremental change of separation that varies smoothly with the displacement such that it corresponds to, for example, a substantially Gaussian distribution. The is modification of the DTL technique improves the uniformity and reproducibility of the printed patterns. A similar improvement to the uniformity and reproducibility of the printed patterns may be alternatively obtained by changing the separation at a constant speed and varying the intensity of the illumination beam during the exposure, as is also described in greater detail in Ser. No. 12/903,389. The mechanical means for longitudinally locating and displacing the substrate relative to the mask are not indicated in FIG. 3 since they are well described in the aforementioned applications and could, based on this teaching, be readily realized by a skilled person in the art of precision mechanical positioning for photolithographic systems, especially for proximity printing systems. The initial separation between the photoresist-coated substrate and the mask prior to the longitudinal displacement may be set to a value of, for example, 50 µm, with the aid of a spacer or spacers with known thickness or using interferometric gap-measuring equipment such as that based on the principle of white-light interferometry.

The resultant intensity distribution exposing the substrate 12 may be determined by simulating the propagation of the light-field transmitted by the mask 5 using standard computational techniques, notably those based on high-accuracy methodologies such as finite difference time domain (FDTD) and rigorous coupled wave analysis (RCWA), though less-accurate methodologies such as based on scalar theory and application of the angular spectrum method may also be employed. The simulation results obtained with the latter methodologies show the general behaviour of the intensity distribution and the form of the pattern that would be printed onto the substrate. The actual dose distribution in the layer of photoresist depends on other parameters that include light polarization, substrate reflectivity and refractive index of the photoresist. These may also be taken into consideration in the simulations using mathematical treatment well known by those skilled in the art.

Figure 4A:
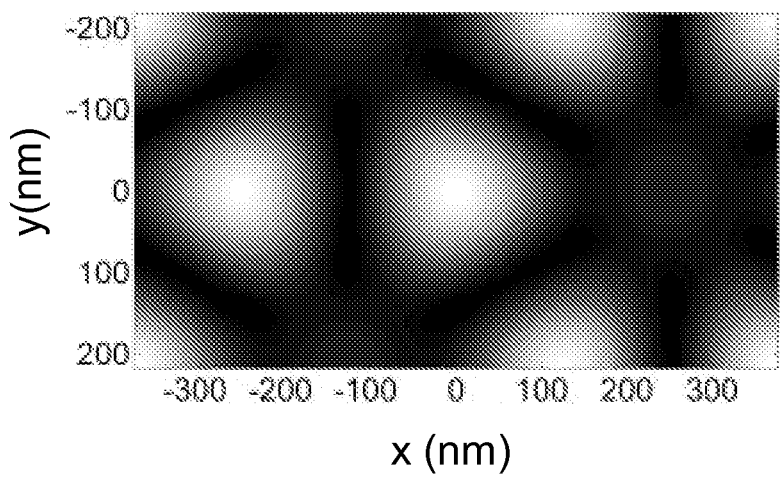
FIG. 4a shows the simulated average intensity distribution exposing the photoresist using the mask of the first embodiment and an ATL or DTL exposure.
Figure 4B:
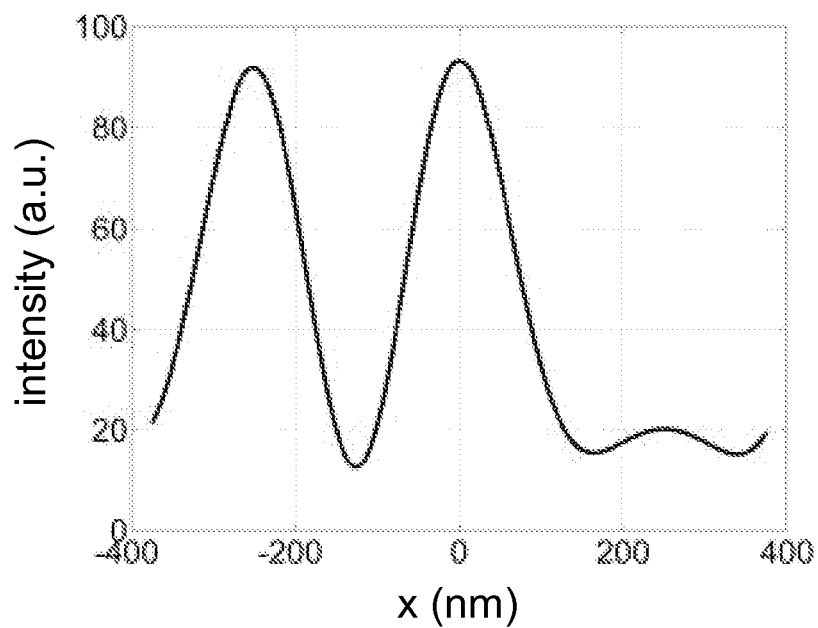

Using an approach based on the scalar theory, the average intensity distribution exposing the photoresist 13 is calculated to be a periodic array of intensity peaks arranged in a honeycomb pattern with the same nearest-neighbour distance as that of the composite pattern in the mask, i.e. 250 nm, as illustrated in FIG. 4a. This value is significantly smaller than that possible using the prior art and this illumination wavelength. FIG. 4b depicts the intensity variation in the x-direction across the centre of the distribution of 4a, indicating the high contrast of the intensity distribution and its suitability for a production photolithographic process. Clearly, if a positive photoresist is used then an array of holes would be printed into the layer 13, whereas with a negative photoresist, an array of posts would be printed. Using an amplitude mask and DTL or ATL according to the teaching of the prior art it is not possible, at an exposure wavelength of 364 nm, to print a honeycomb intensity distribution with such a small nearest-neighbour distance. This embodiment thus demonstrates a considerable advantage of the present invention for printing periodic patterns of features arranged on a honeycomb grid.

Figure 5A:
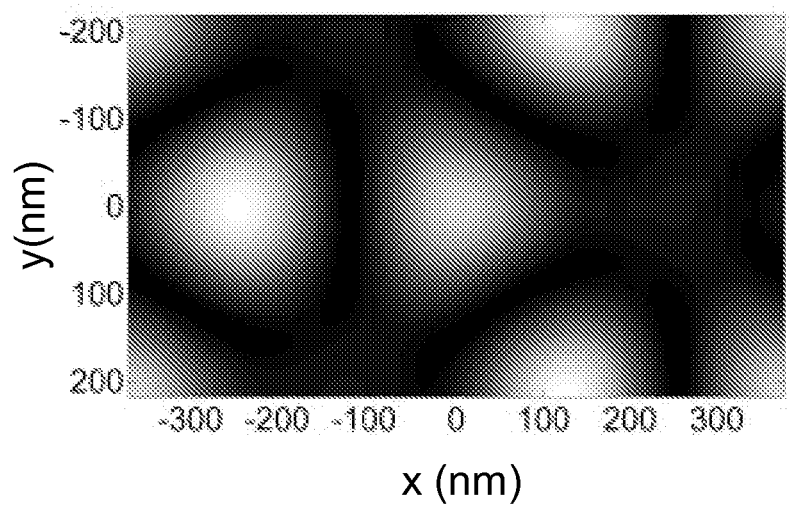
FIG. 5a shows the simulated average intensity distribution exposing the photoresist produced by a mask employed in the first embodiment that has phase-shifts that deviate from the design values.
Figure 5B:
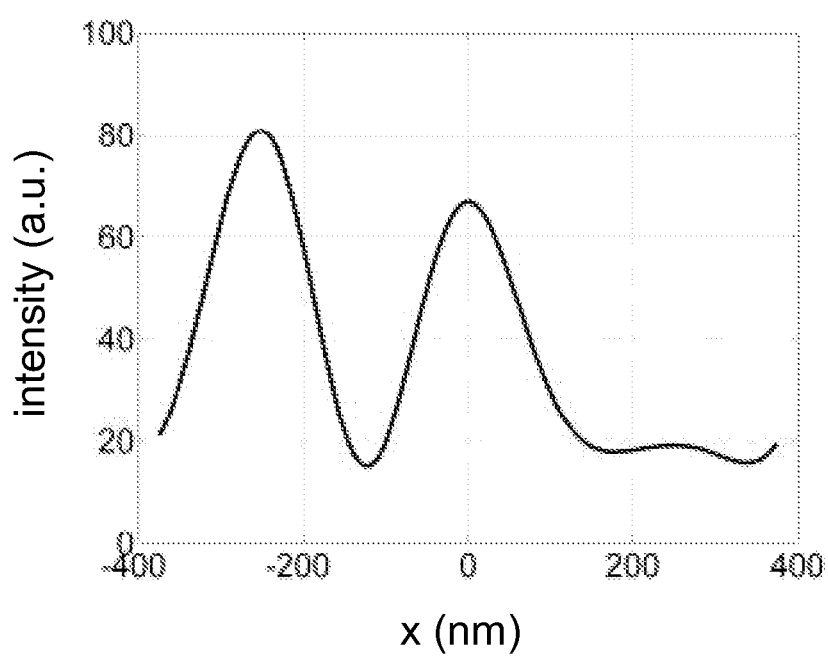

Whereas specific hole depths and associated phase shifts are indicated above for the second and third sub-patterns in this embodiment, it is determined from computer simulations that the form of the average intensity distribution and the contrast of the peaks exposing the photoresist have low sensitivity to departures of the hole depths from these values when the ratio of the depths in the second and third sub-patterns (and associated resulting phase-shifts) is 1:2. From analysis of the dependencies, it is though preferable, when this ratio is satisfied, that the relative phase shift introduced by the second sub-pattern is in the range 25° to 85° and that the relative phase shift introduced by the third sub-pattern is in the range 50° to 170°, and most preferable that the relative phase shift introduced by the second sub-pattern is in the range 35° to 75° and that the relative phase shift introduced by the third sub-pattern is in the range 70° to 150°. However, the average distribution is less tolerant to a change of the hole depths when it changes the ratio for the second and third sub-patterns from 1:2. For example, when the phase shifts introduced by the second and third sub-patterns are 36° and 88° (corresponding to a ratio ~2.4), the intensity of the peaks in the average distribution exposing the photoresist are not uniform but vary, in a periodic manner across the pattern, as illustrated in FIG. 5a. The intensity profile in the x direction across the centre of this distribution, which is depicted in FIG. 5b, shows a ~20% variation of the peak intensities. From analysis of the dependence of variability of the peak intensities on phase deviations, it is preferable that the ratio of the phase shifts introduced by the second and third sub-patterns in the range 1:1.6 to 1:2.4, and most preferable that it is in the range 1:1.8 to 1:2.2, though ratios outside the former range might also be tolerated depending on the lithographic requirements of the particular application.

Figure 6:
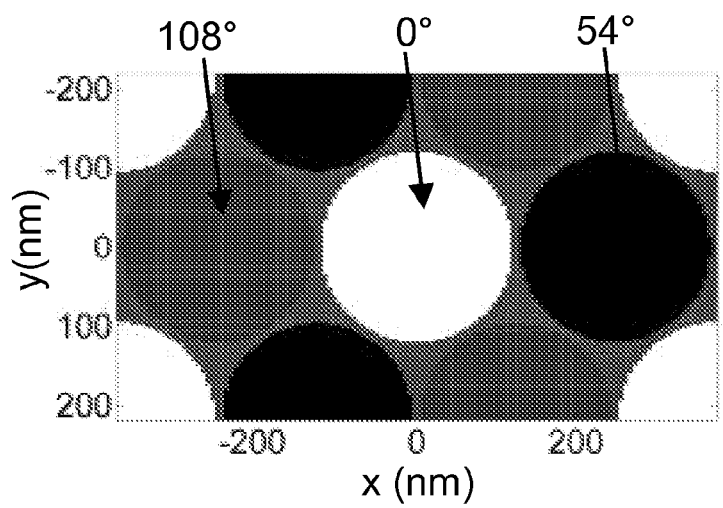
FIG. 6 shows a modified design of the phase-shift mask employed in the first embodiment that has larger features.
Figure 7A:
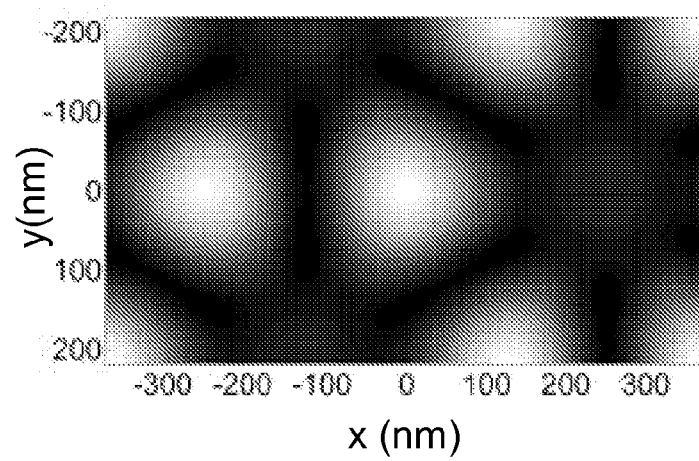
FIG. 7a shows the simulated average intensity distribution exposing the photoresist using the mask of FIG. 6 and an ATL or DTL exposure.
Figure 7B:
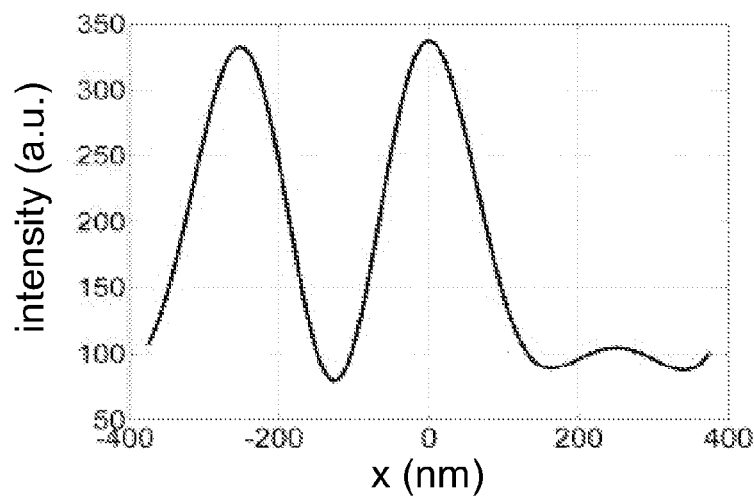

Further, whereas a specific diameter of hole is indicated in the mask design above, it is determined from computer simulations that the form of the resultant average intensity distribution exposing the photoresist using this embodiment is substantially independent of the diameter of the hole. For example, using the same basic mask design as in FIG. 1 but with a hole diameter of 240 nm in all sub-patterns such that edges of neighbouring holes are nearly touching (see FIG. 6) produces substantially the same form of intensity distribution at the photoresist that has substantially the same contrast of intensity variation in the x-direction across the centre of this distribution (see FIGS. 7a and 7b). Because the transmission of the mask with the larger holes is higher, the peak intensity of the distribution is substantially higher in this case, which is advantageous for reducing the time required to correctly expose the photoresist. By extrapolation, it can be expected that a chrome-less mask having the same configuration of sub-patterns and associated phases, but with fully transparent hexagonal zones instead of holes in an opaque layer, would print a similar pattern and enable a shorter exposure time.

Figure 8A:
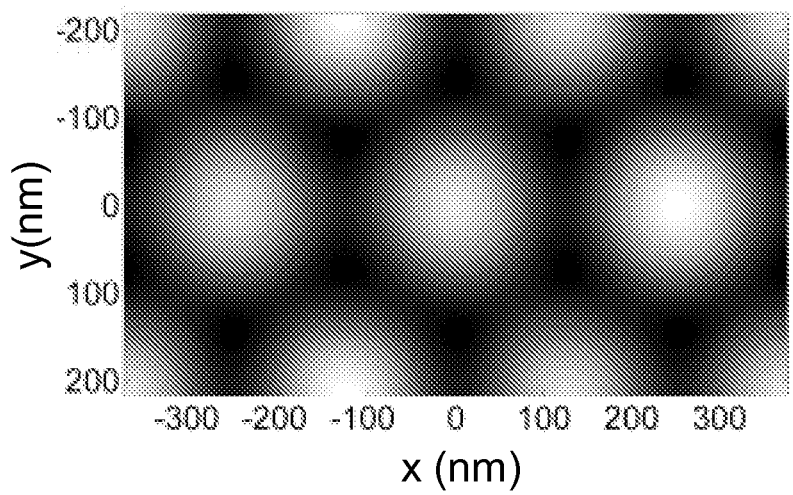
FIG. 8a shows the simulated average intensity distribution exposing the photoresist produced by a mask employed in a second embodiment that has phase-shifts that deviate slightly from the ideal design values.
Figure 8B:
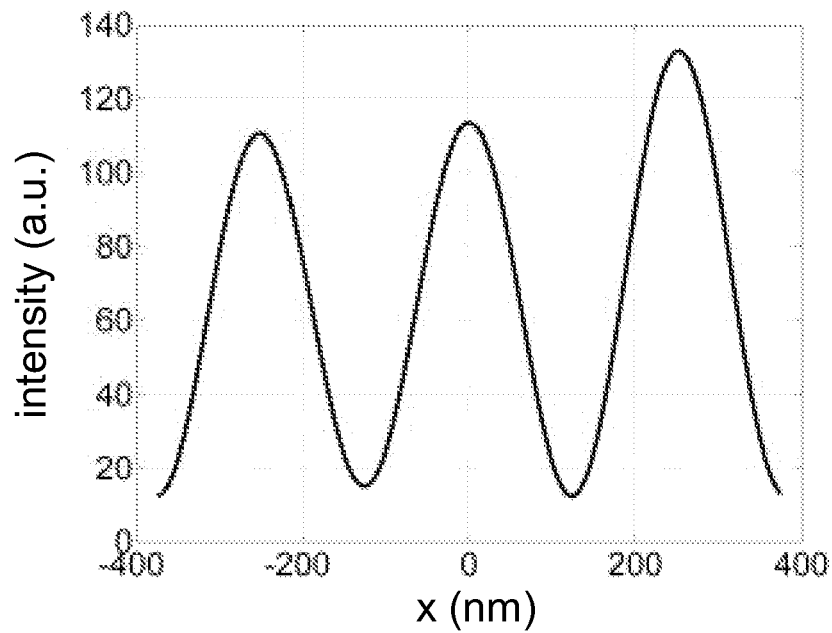

In this first embodiment for printing a honeycomb pattern of features from a composite pattern in mask having features arranged on a hexagonal grid, it is necessary that the nearest-neighbour distance, a, of the holes in the composite pattern satisfies $2\lambda/3 < a < 2\lambda/\sqrt{3}$. In a second, similar embodiment, the depths of the holes of the second and third sub-patterns in the design of FIG. 1 are more deeply etched so that the phases of the light transmitted by those sub-patterns are shifted by 120° and 240° respectively relative to the light transmitted by the first sub-pattern. The light-field transmitted by this mask mainly comprises three 1st diffraction orders which mutually interfere to produce a hexagonal array of intensity peaks with the same nearest-neighbour distance as the composite pattern in the mask, i.e. 250 nm. With an ideal mask, such a combination of phase shifts from the sub-patterns would produce no 0th diffraction order. However, diffraction of the light within the structure of the mask, does result in some 0th-order light which modulates the interference pattern in the direction away from the mask, thereby limiting the depth of focus of the transversal distribution. This modulation is larger in practice because inaccuracies in the mask fabrication process produces non-ideal phase-shifts of the light transmitted by the second and third sub-patterns, which amplifies the intensity of the 0th-order beam. Using the DTL or ATL technique therefore enables a hexagonal pattern of features to be printed with a nearest-neighbour distance of 250 nm and with a large depth of focus, which would not be possible at this wavelength using the prior-art techniques of ATL and DTL. Simulations of the integrated intensity distribution that exposes the photoresist with this design of mask confirm the formation of a high-contrast image. With deviations of the phase-shifts from the ideal values, the intensity peaks in the resulting distribution are not, however, uniform across the pattern, but vary in a periodic manner. For example, if the phase-shifts produced by the second and third sub-patterns are respectively 126° and 252°, then the resulting average intensity distribution exposing the photoresist using the DTL technique is calculated to be as shown in FIG. 8a. The intensity variation in the x direction across the centre of this distribution is depicted in FIG. 8b, showing a ~20% non-uniformity in the peak intensities. Using a mask that produces exactly 120° and 240° phase shifts from the second and third sub-patterns results in equal intensity peaks. From analysis of the dependencies, it is therefore possible to specify the maximum acceptable deviations of the phase-shifts produced by the second and third sub-patterns in order that the printed pattern satisfies the requirements of the particular application.

This periodic variability of peak intensities in the average distribution exposing the photoresist using the ATL or DTL techniques may be reduced or eliminated by illuminating the mask at a number of different angles of incidence, either sequentially or simultaneously, with preferably the same exposure dose at each of the angles. A small angular offset, $\Delta\phi$, of the illumination beam causes the intensity distribution illuminating the photoresist layer to laterally displace by a distance given by $L \Delta\phi$, where L is the separation of the layer and mask, in the plane containing the angular offset (as is described in more detail in U.S. patent application Ser. No. 12/706,081, for which it is employed for a different purpose). Therefore, by sequentially or simultaneously illuminating the mask at two or more angles of incidence that are selected so the distances and directions of offset between the respective intensity distributions illuminating the photoresist correspond to the periods and array axes of the printed pattern, then the intensity peaks of the different intensity distributions are superposed at the photoresist, thus enabling a higher uniformity of peak intensity in the integrated distribution. With respect to the particular mask design of the second embodiment, by illuminating the mask at three angles of incidence such that the average intensity distributions produced at the photoresist by the second and third angles are offset with respect to that produced by the first angle by one nearest-neighbour distance of the printed pattern in directions of, respectively, a first and a second array axes of the printed pattern, then the intensity peaks in the integrated distribution are rendered uniform, even if the depths of the etched features in the second and third sub-patterns deviate from the ideal values. The different angles of the illumination employed in this scheme do though reduce the depth of focus of the printed pattern, but this may be alleviated by using a larger separation of the substrate and mask.

A uniform pattern of intensity peaks may be printed from the same, non-ideal mask by alternatively performing a set of sequential ATL or DTL exposures using a single angle of illumination and additionally laterally displacing the photoresist-coated substrate relative to the mask between exposures. By displacing the substrate between exposures by a distance of one period of the printed array in the direction of an array axis, the intensity peaks in the average distributions of the two exposures can be superposed. Thus, for the particular mask design of second embodiment, by performing three exposures and displacing the substrate relative to the mask so that the distances and directions of offset between the respective exposures correspond to those achieved using the three angles of illumination in the scheme described above, then the peak intensities in the integrated intensity distribution are also rendered uniform. Since this alternative procedure only requires a single angle of illumination, the integrated intensity distribution advantageously has the same large depth of focus as that afforded by the DTL and ATL techniques. Its implementation requires that high-precision actuators, such as piezo-electric transducers, are incorporated in the exposure system for displacing the photoresist-coated substrate with respect to the mask (or vice versa) in both x and y directions, and preferably also sensors for accurately measuring and ensuring that the displacement is performed to the precision required.

These auxiliary exposure schemes allow uniform patterns to be printed from non-ideal PSMs, and so are important for the practical implementation of PSMs with the DTL or ATL techniques.

In this second embodiment for printing a periodic pattern of features from a composite periodic pattern in mask with features arranged on a hexagonal grid, it is necessary that the nearest-neighbour distance, a, of the holes in the composite pattern satisfies a >2λ/3.

Figure 9:
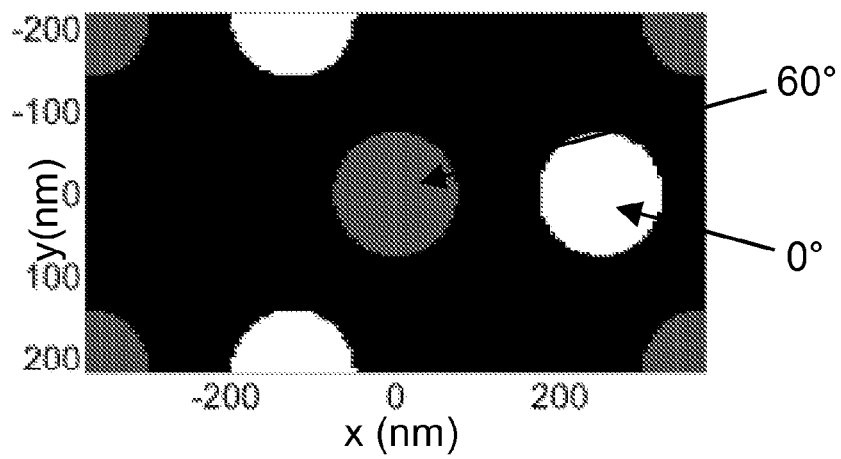
FIG. 9 shows a design of a honeycomb pattern of features in a phase-shift mask employed in a third embodiment.
Figure 10A:
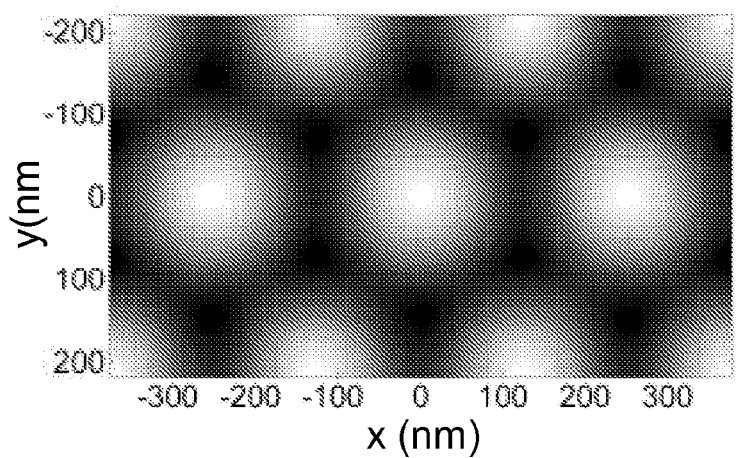
FIG. 10a shows the simulated average intensity distribution exposing the photoresist using the mask of the third embodiment and an ATL or DTL exposure.
Figure 10B:
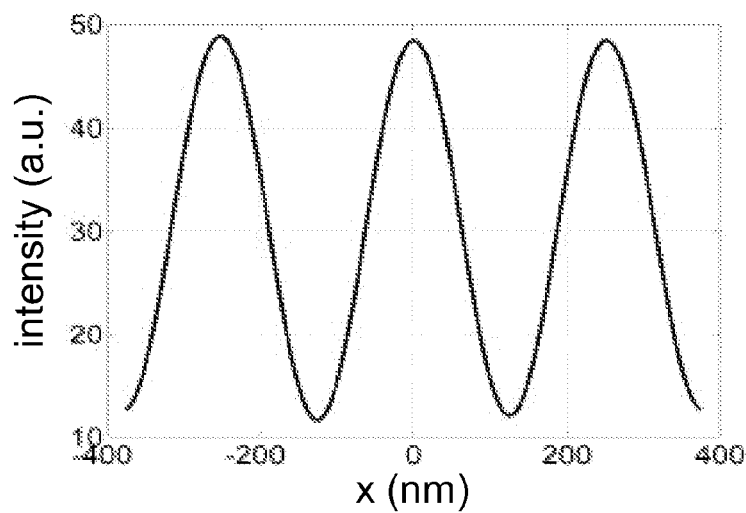

In a third embodiment of the present invention, with reference to FIG. 9, a composite pattern of features in a mask comprises an array of holes with diameter 150 nm arranged on a honeycomb grid with a nearest-neighbour distance, a=250 nm, that has been formed in an opaque layer of chrome on a fused silica substrate (FIG. 9 only shows a repeating cell of the composite pattern). The pattern is composed of two overlapping but mutually offset sub-patterns, the holes within each sub-pattern being arranged on a hexagonal grid with a nearest-neighbour distance, b=√3a=433 nm. The surface of the fused silica substrate within the holes of the second sub-pattern has been substantially uniformly etched to a depth of 116 nm so that, when the mask illuminated at normal incidence by light with wavelength 364 nm, the light transmitted by the second sub-pattern is shifted in phase by 60° with respect to that transmitted by the first sub-pattern. Without a phase shift, the light-field transmitted by the mask would include 0th and 1st diffraction orders, so would be able to print a periodic pattern using a DTL-type exposure; however, computer simulation shows that the average intensity distribution exposing the photoresist comprises intensity peaks arranged on a hexagonal grid with a nearest-neighbour-distance of 433 nm, signifying that the higher-resolution component of the mask pattern has been effectively lost. Computer simulation of the average intensity distribution exposing the photoresist using instead the mask with the phase-shifting second sub-pattern yields the result shown in FIG. 10a, and the intensity variation in the x direction across the centre of this distribution is depicted in FIG. 10b. Whereas this distribution also comprises intensity peaks arranged on a hexagonal grid, the nearest-neighbour distance is the same as that of the composite pattern in the mask, i.e. 250 nm. This is significantly smaller than that possible using DTL according to the prior art and this illumination wavelength, thus representing a significant gain in resolution. This embodiment therefore demonstrates a considerable advantage of the present invention for printing periodic patterns of features arranged on a hexagonal grid.

Figure 11A:
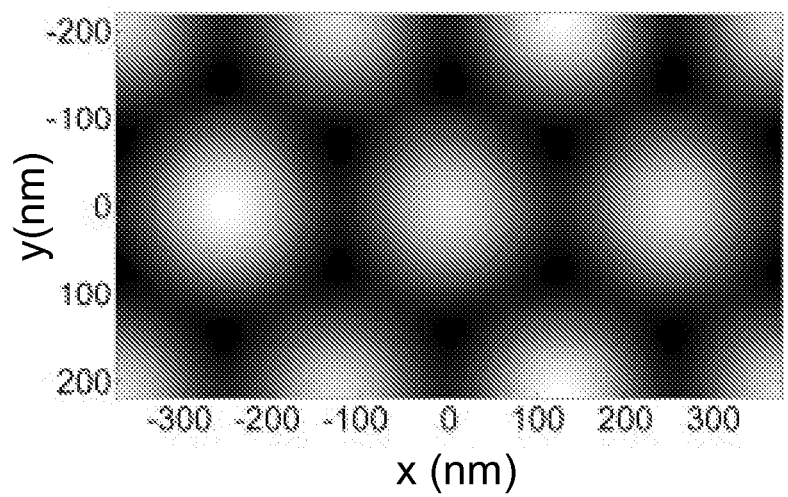
FIG. 11a shows the simulated average intensity distribution exposing the photoresist produced by a mask employed in the third embodiment that has a phase-shift that deviates from the design value.
Figure 11B:
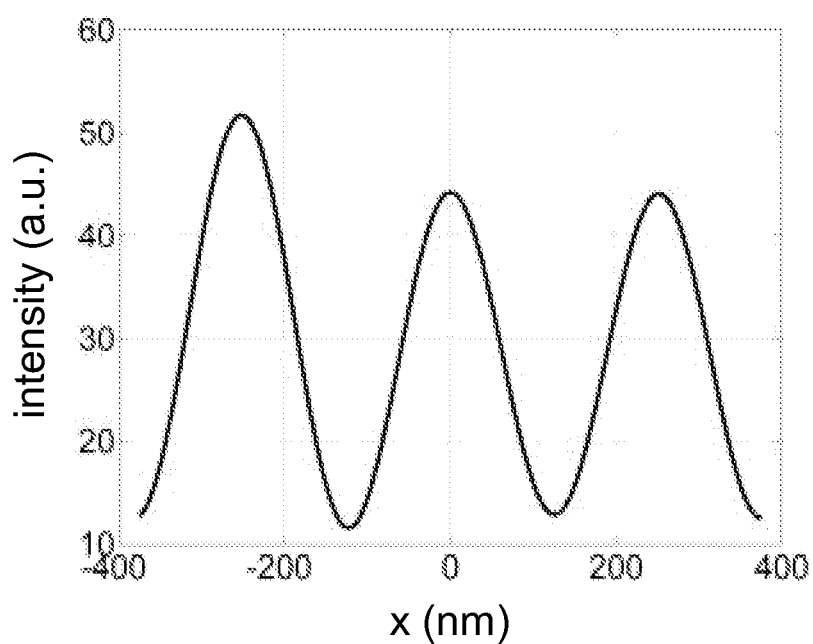

Computer simulations show, however, that the form of the resultant intensity distribution exposing the photoresist has some sensitivity to deviations of the hole depth and associated phase-shifts from the above-indicated values than with the mask design of the first embodiment. For example, if the depths of the holes in the second sub-pattern produce instead a phase shift of 54° then it is calculated that the average intensity distribution exposing the photoresist using the DTL technique is as shown in FIG. 11a. The intensity variation in the x direction across the centre of this distribution is depicted in FIG. 11b, from which can be seen that the intensities of the peaks are not uniform but vary, in a periodic manner across the pattern, by ~15%. It is therefore most preferable that the depths of the holes in the second sub-pattern introduce a phase-shift in the range 55° to 65° though, depending on the lithographic requirements of the particular application, a larger range may be tolerated. This embodiment has the advantages of only requiring a single phase etch step and a shallow etch depth.

Figure 12A:
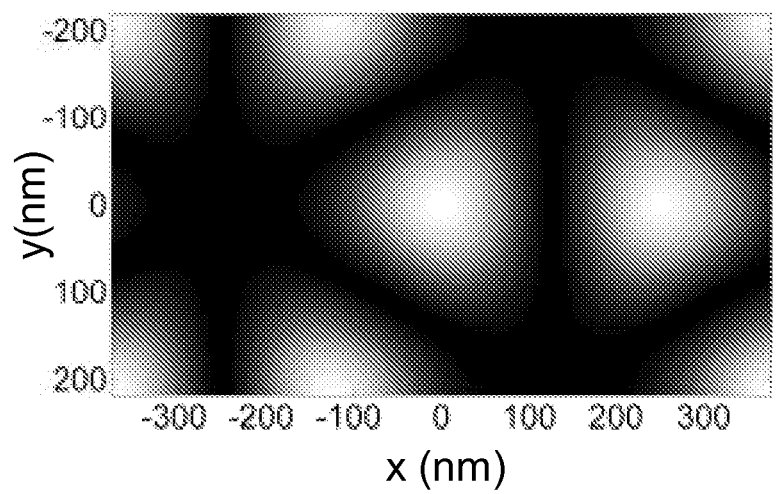
FIG. 12a shows the simulated average intensity distribution exposing the photoresist using a mask employed in a fourth embodiment and an ATL or DTL exposure.
Figure 12B:
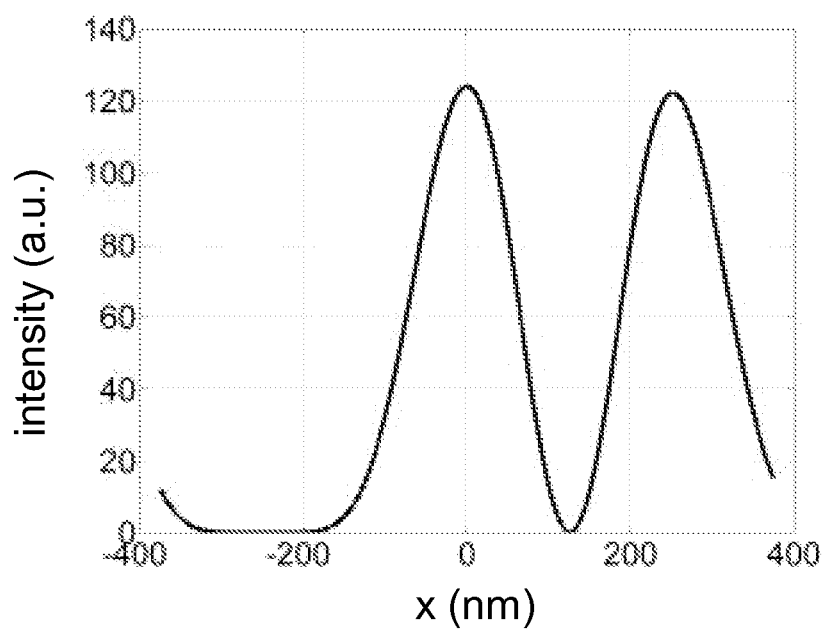

In a fourth, similar embodiment, the depths of the holes of the second sub-pattern in the design of FIG. 9 are more deeply etched so that the phase of the light transmitted by that sub-patterns are shifted is shifted by 180° with respect to the light transmitted by the first sub-pattern. Computer simulation of the average intensity distribution illuminating the photoresist-coated substrate when longitudinally displacing the substrate with respect to the mask yields a honeycomb array of intensity peaks with a nearest-neighbour distance of 250 nm, as illustrated in FIG. 12a. This would not be possible using an amplitude mask and this exposure wavelength. The intensity variation in the x direction across the centre of this distribution is depicted in FIG. 12b which shows that the intensity peaks have a high contrast, so are suitable for a production process. Computer simulations show that this design of phase mask for printing a honeycomb array of intensity peaks with the DTL technique is relatively insensitive to deviations of phase-shift from 180° produced by the second sub-pattern. From analysis of the dependence, it is determined that for printing a honeycomb pattern using the mask pattern-type of this embodiment, it is preferable that the phase shift produced by the second sub-pattern is in the range 90° to 270°, and most preferable that it is in the range 120° to 240°.

Whereas a specific diameter of hole is indicated in the mask design of this embodiment, computer simulations show that the form of the resulting average intensity distribution exposing the photoresist using the DTL technique is substantially insensitive to the hole diameter. A larger hole diameter enables a greater transmission of light through the mask, which is advantageous for reducing the time required for printing the pattern into the photoresist.

In these embodiments for printing a periodic pattern of features from a composite periodic pattern in a mask whose features are arranged on a honeycomb grid, it is necessary that the nearest-neighbour distance, a, of the holes in the composite pattern in the mask satisfies a >2λ/3.

Figure 13:
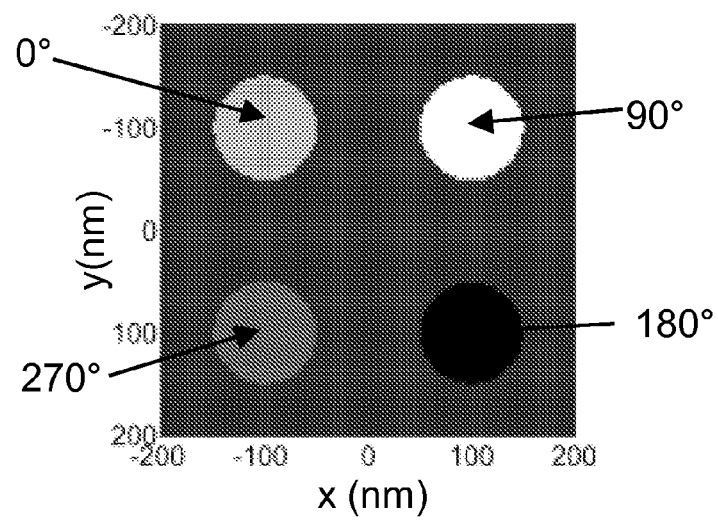
FIG. 13 shows a design of a square-grid pattern of features in a phase-shift mask employed in a fifth embodiment.

In a fifth embodiment of the present invention, with reference to FIG. 13, a composite pattern of features in a mask comprises an array of holes of diameter 100 nm arranged on a square grid with a nearest-neighbour distance (i.e. period), a=of 200 nm in both x and y directions, that has been formed in an opaque layer of chrome on a fused silica substrate (FIG. 13 only shows a repeating cell of the composite pattern). The pattern is composed of four overlapping but mutually offset sub-patterns of holes, the holes of each sub-pattern being arranged on a square grid with a nearest-neighbour distance (i.e. period), b=2a=400 nm in both x and y directions. The surface of the fused silica substrate has been etched within the holes of the second sub-pattern to a depth 194 nm, within the holes of the third sub-pattern to a depth of 387 nm, and within the holes of the fourth sub-pattern to a depth of 581 nm. When this mask is introduced in the exposure system of FIG. 3 and illuminated in the same manner as in the first embodiment, the depths of the etched features in the second, third and fourth sub-patterns cause the phase of the light transmitted by those sub-patterns to be shifted by 90°, 180° and 270° respectively relative to the light transmitted by the features of the first sub-pattern. If the holes of the composite pattern in the mask were simply formed in a layer of chrome on a substrate without the different depths of feature in the sub-patterns, i.e. according to the teaching of the prior art, then the sub-wavelength period of the holes would only allow the 0th diffraction order to propagate, and thus it would be impossible to print a periodic pattern onto the substrate. With the aforementioned phase-shifts, however, the transmitted light-field comprises a 0th and 1st orders which mutually interfere to generate a series of Talbot planes. In this embodiment the polar angle, $\theta_1$, of the 1st diffraction orders is related to the period of the features, b, in the sub-patterns by $$\sin \theta_1 = \lambda/b \qquad \text{equ. (5)}$$

The Talbot distance may again be determined using equ. (4).

Figure 14A:
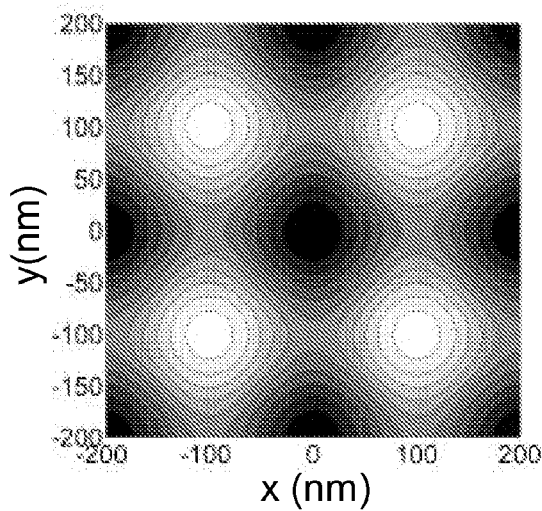
FIG. 14a shows the simulated average intensity distribution exposing the photoresist using the mask of the fifth embodiment and an ATL or DTL exposure
Figure 14B:
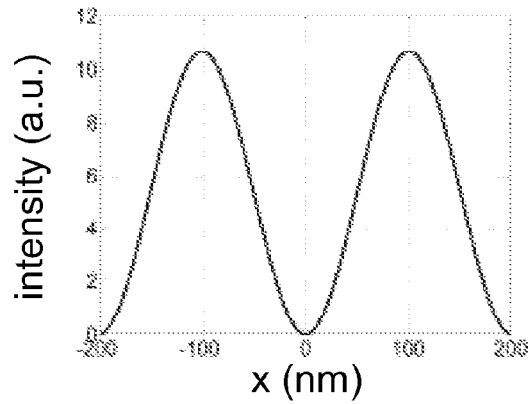

Computer simulation of the average intensity distribution printed into the photoresist when displacing the substrate with respect to the mask according to the DTL technique yields an array of intensity peaks arranged on a square grid with a nearest-neighbour distance (i.e. period) of 200 nm, as illustrated in FIG. 14a. FIG. 14b depicts the intensity variation in the x-direction across the centre of the distribution of FIG. 14a, indicating the high contrast of the intensity peaks. Using an amplitude mask and DTL or ATL according to the teaching of the prior art it would not possible, using an exposure wavelength of 364 nm, to print a square-grid intensity distribution with such a small nearest-neighbour distance. This embodiment thus demonstrates a considerable advantage of the present invention for printing periodic patterns of features arranged on a square grid.

Figure 15:
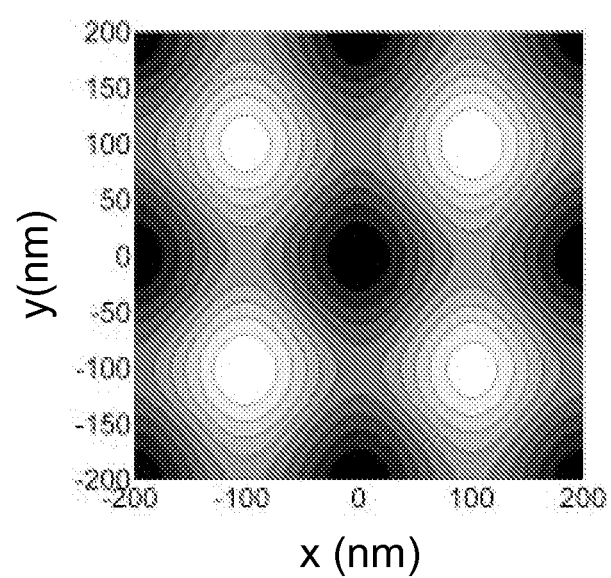
FIG. 15 shows the simulated average intensity distribution exposing the photoresist produced by a mask employed in the fifth embodiment that has phase-shifts that deviate from the design values.

Computer simulations show, however, that for this mask design the average intensity distribution exposing the photoresist has some sensitivity to deviations of the hole depth from the above-indicated values. For example, if the depths are such that the phase of the light transmitted by the third and fourth sub-patterns is instead shifted by respectively 200° and 300°, then the average intensity distribution exposing the photoresist using the DTL technique is determined to be as shown in FIG. 15. As can be seen, the deviations of phase have introduced some ellipticity into the cross-sectional shape of the intensity peaks. Further, with asymmetric deviations of the phase-shifts produced by the second and third sub-patterns from the required values, computer simulations show that non-uniformity of peak intensity is additionally introduced into each unit cell of the periodic average intensity distribution. From analysis of the dependencies, it may be concluded that it is preferable that the depths of the holes in the second, third and fourth sub-patterns introduce phase-shift in the ranges 80° to 100°, 170° to 190° and 260° to 280° respectively with respect to the first sub-pattern though, depending on the lithographic requirements of the particular application, larger ranges may be tolerated.

Figure 16:
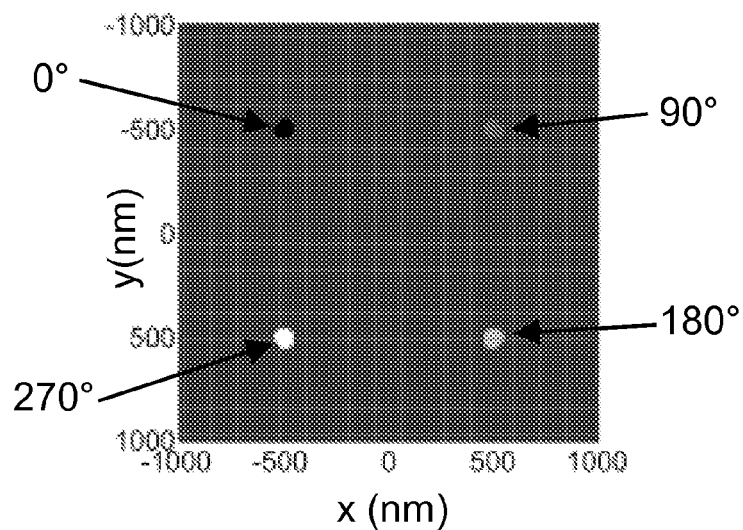
FIG. 16 shows a design of a square-grid pattern of features with small duty-ratio in a phase-shift mask employed in a sixth embodiment.
Figure 17A:
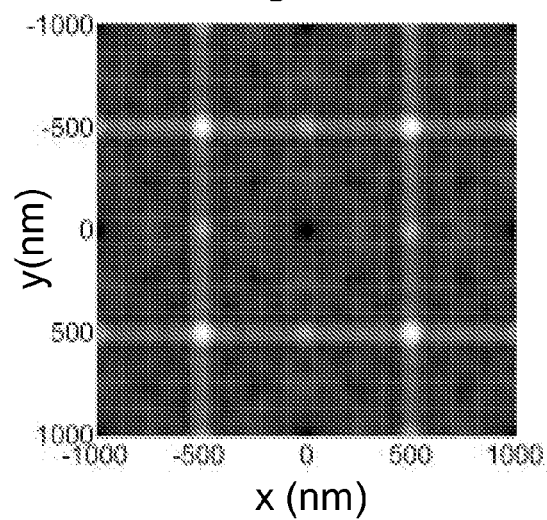
FIG. 17a shows the simulated average intensity distribution exposing the photoresist produced by the mask of the sixth embodiment and an ATL or DTL exposure.
Figure 17B:
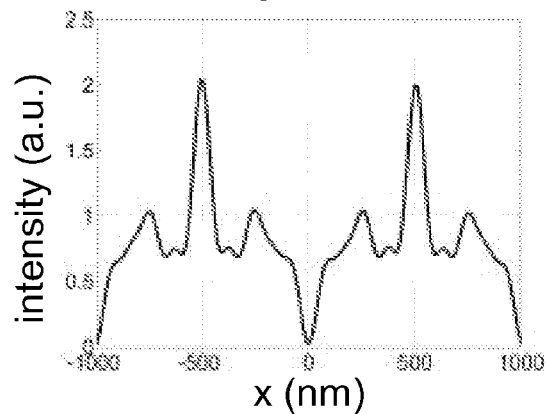

In a sixth, related embodiment, with reference to FIG. 16, a composite pattern of features in a mask comprises an array of holes of diameter 100 nm arranged on a square grid with a nearest-neighbour distance (i.e. period), a=of 1 µm in both x and y directions, that has been formed in an opaque layer of chrome on a fused silica substrate (FIG. 16 only shows a repeating cell of the composite pattern). The pattern is composed of four overlapping and mutually offset sub-patterns of holes, the holes of each sub-pattern being arranged on a square grid having a nearest-neighbour distance (i.e. period), b=2a=2 µm. For this embodiment, the illumination system instead employs an ArF excimer laser as the light source which emits at a wavelength of 193 nm. The surface of the fused silica substrate is etched within the holes of the second, third and fourth sub-patterns to depths of 86 nm, 172 nm and 258 nm respectively. When this mask is introduced in the exposure system of FIG. 3 that has been modified to provide a collimated illumination beam at the wavelength of 193 nm, the depths of the etched features in the second, third and fourth sub-patterns shift the phase of the light transmitted by those sub-patterns by 90°, 180° and 270° respectively relative to the light transmitted by the first sub-pattern. Computer simulation of the average intensity distribution exposing the photoresist using this mask and the DTL technique yields a square mesh of narrow, high-intensity lines with a period of 1 µm, as illustrated in FIG. 17a. The variation of intensity in the x-direction across the centre of this distribution is depicted in FIG. 17b. These results demonstrate that this design of phase-shift mask may be employed with ATL or DTL for printing a continuous grid, or mesh-like structure, with a line-width as narrow as ~100 nm, into a photoresist layer. The intensity minimum at the centre of the distribution may be alternatively used to print a high-resolution pattern, using, for example, a negative photoresist process.

Figure 18:
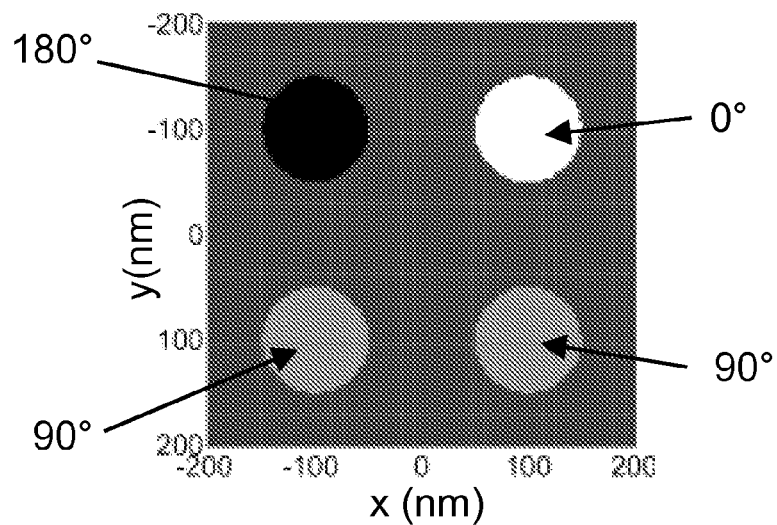
FIG. 18 shows a design of a square-grid pattern of features in a 3-level phase-shift mask employed in a seventh embodiment.
Figure 19A:
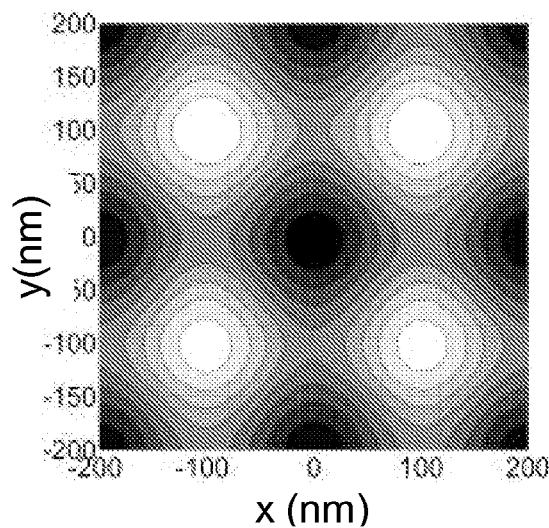
FIG. 19a shows the simulated average intensity distribution exposing the photoresist produced by the mask of the seventh embodiment and an ATL or DTL exposure.
Figure 19B:
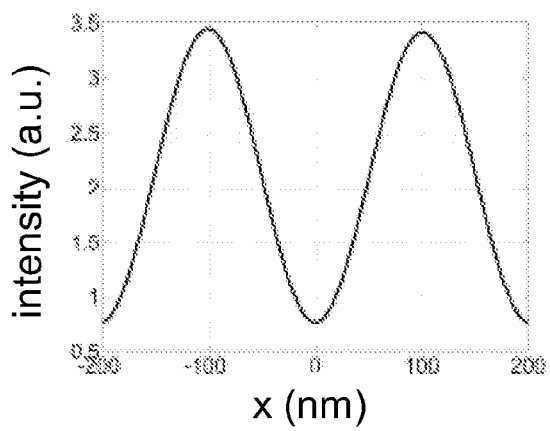

In a seventh, related embodiment, with reference to FIG. 18, a composite pattern of features in a mask comprises an array of holes of diameter 100 nm arranged on a square grid with a nearest-neighbour distance (i.e. period), a=200 nm in x and y directions, that has been formed in an opaque layer of chrome on a fused silica substrate (FIG. 18 only shows a repeating cell of the composite pattern). The pattern of features can be considered as composed of four overlapping but mutually offset sub-patterns of holes, the holes of each sub-pattern being arranged on a square grid with a nearest-neighbour distance (i.e. period), b=2a=400 nm in both x and y directions. The surface of the fused silica substrate has been etched within the holes of the second and third sub-patterns to a depth 194 nm, and within the holes of the fourth sub-pattern to a depth of 387 nm. When this mask is introduced in the exposure system of FIG. 3 and illuminated in the same manner as in the first embodiment, the depths of the etched features in the sub-patterns causes the phase of the light transmitted by the second and third sub-patterns to be shifted by 90° respectively with respect to the light transmitted by the features of the first sub-pattern, whilst that transmitted by the fourth sub-pattern is shifted by 180°. If the holes of the composite pattern in the mask were simply formed in a layer of chrome on a substrate without the different depths of feature in the sub-patterns, i.e. according to the teaching of the prior art, then the sub-wavelength period of the holes would only allow the 0th diffraction order to propagate, and thus it would be impossible to print a periodic pattern onto the substrate. With the aforementioned phase-shifts, however, the transmitted light-field comprises a 0th and 1st orders which mutually interfere to generate a series of Talbot planes. Computer simulation of the average intensity distribution printed into the photoresist when displacing the substrate with respect to the mask according to the DTL technique yields an array of intensity peaks arranged on a square grid with a nearest-neighbour distance (i.e. period) of 200 nm, as illustrated in FIG. 19a. FIG. 19b depicts the intensity variation in the x-direction across the centre of the distribution of FIG. 19a, indicating the high contrast of the intensity peaks. This embodiment thus demonstrates a considerable advantage of the present invention for printing periodic patterns of features arranged on a square grid. In comparison with the previous embodiment, this mask design only has three phase levels, thus simplifying the fabrication process, and also the largest phase transition between neighbouring sectors of the periodic pattern is 180°, which reduces perturbations of the printed pattern arising from diffraction effects within the mask.

Figure 20:
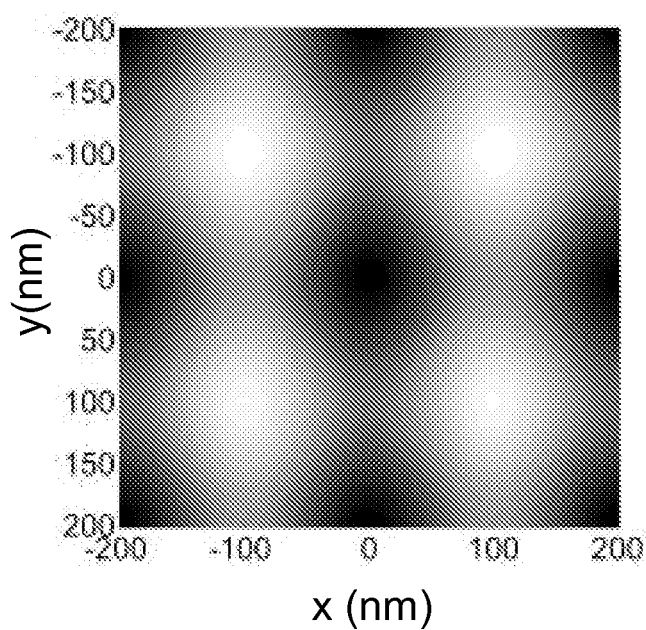
FIG. 20 shows the simulated average intensity distribution exposing the photoresist produced by a mask employed in the seventh embodiment, whose phase-shifts deviate from the design values.

Computer simulations show that with this mask design the average intensity distribution exposing the photoresist also has some sensitivity to deviations of the hole depth from the above-indicated values. For example, if the depths are such that the phase of the light transmitted by the second and third sub-patterns is instead shifted by 82° and that transmitted by the fourth sub-pattern is shifted by 164°, then the average intensity distribution exposing the photoresist using the DTL technique is determined to be as shown in FIG. 20. As can be seen, the changes of phase have introduced some ellipticity into the cross-sectional shape of the intensity peaks. Further, with asymmetric deviations of the phase shifts produced by the second and third sub-patterns from the required values, computer simulations show that non-uniformity of peak intensity is additionally introduced into each unit cell of the periodic average intensity distribution. From analysis of the dependencies, it can be concluded that it is preferable that the depths of the holes in the second and third sub-patterns introduce phase shift in the range 85° to 95°, and preferable that the holes in the fourth sub-pattern introduces a phase-shift in the range 170° to 190° though, depending on the lithographic requirements of the particular application, larger ranges may be tolerated.

Figure 21:
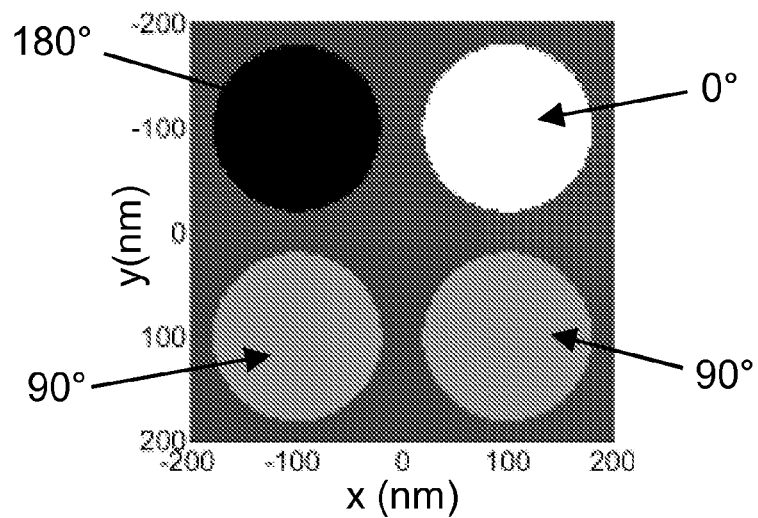
FIG. 21 shows a modified design of the phase-shift mask employed in the seventh embodiment that has larger features.
Figure 22A:
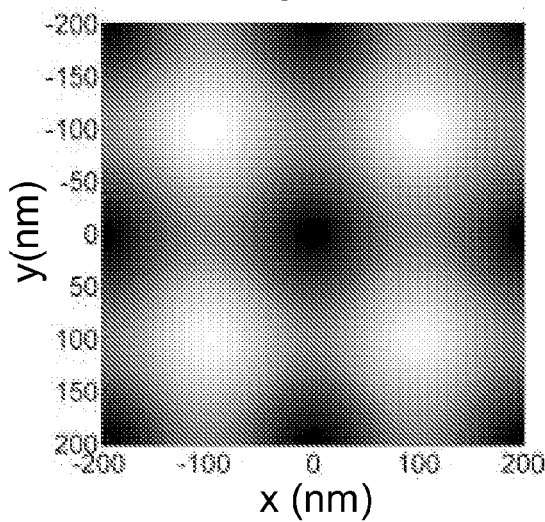
FIG. 22a shows the simulated average intensity distribution exposing the photoresist using the mask of FIG. 21 and an ATL or DTL exposure.
Figure 22B:
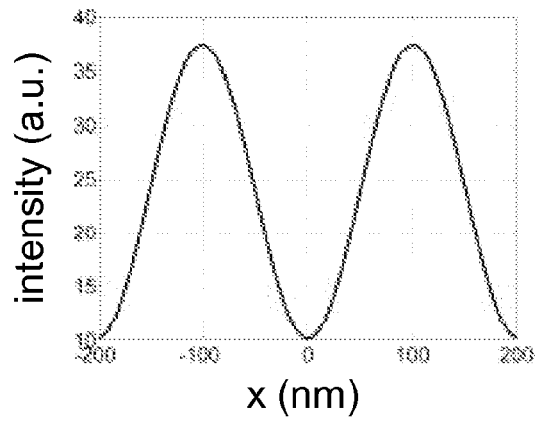

It is further determined from computer simulations that the cross-sectional shape of the peaks in the average intensity distribution obtained from the mask of this embodiment is substantially independent of the diameter of the holes in the mask, and that the contrast of the peaks in distribution decreases with larger hole size. For example, by increasing the diameter of the holes from 100 nm to 160 nm, so that the mask design is as illustrated in FIG. 21, the resulting average intensity distribution exposing the photoresist using the DTL technique is as shown in FIG. 22$a$, whose intensity profile in the x-direction across the centre of the distribution is shown in FIG. 22$b$.

Figure 23:
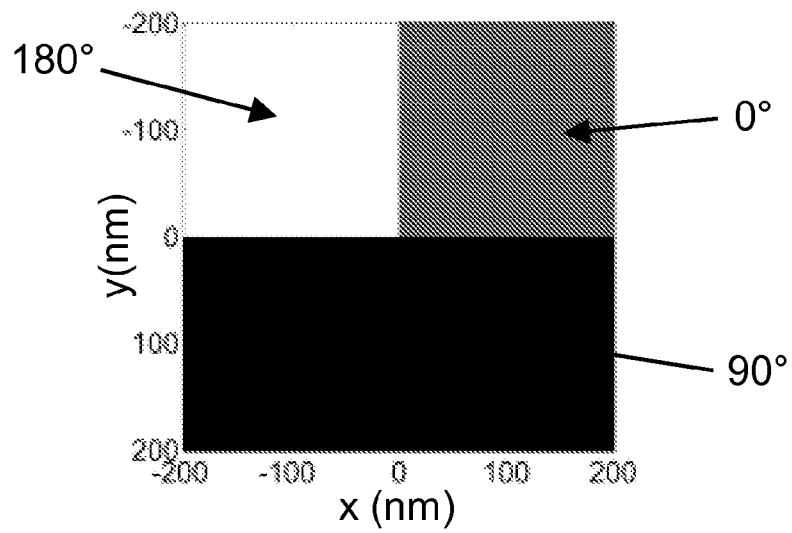
FIG. 23 shows a design of a square-grid pattern of features in a fully transparent phase-shift mask in an eighth embodiment.
Figure 24A:
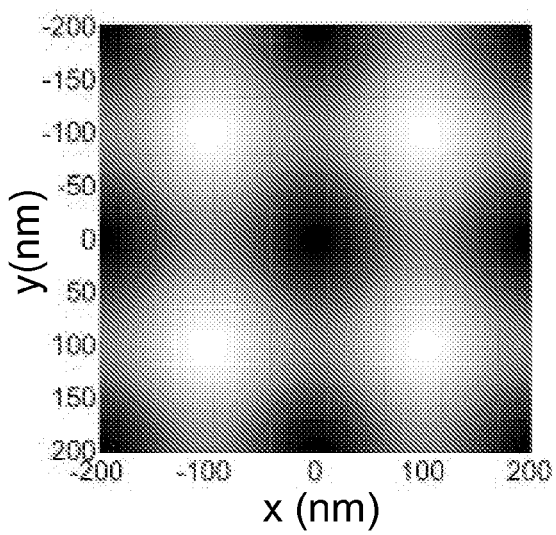
FIG. 24a shows the simulated average intensity distribution exposing the photoresist produced by the mask of the eighth embodiment and an ATL or DTL exposure.
Figure 24B:
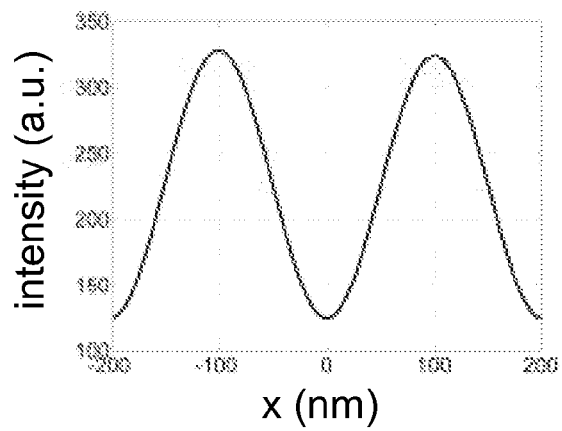

It is moreover determined from computer simulation that a chrome-less mask employed in an eighth embodiment that has the same array geometry and phase distribution as the mask of the seventh embodiment but with fully open areas within each quadrant of the repeating cell, as illustrated in FIG. 23, instead of holes within a chrome layer, produces substantially the same form of average intensity distribution at the photoresist (see FIG. 24$a$) when exposing with the DTL or ATL technique. The variation of intensity in the x-direction across the centre of FIG. 24$a$ is depicted in FIG. 24$b$, showing that the contrast of the intensity distribution is, however, less. Evidently, a chrome-less mask has a very high transmission, which is advantageous for minimizing the time required to print the pattern into the photoresist.

In these embodiments for printing a periodic pattern of features from a composite periodic pattern in a mask with features arranged on a square grid, it is necessary that the nearest-neighbour period, a, of the features in the composite pattern in the mask satisfies a >$\lambda$/2.

Figure 25:
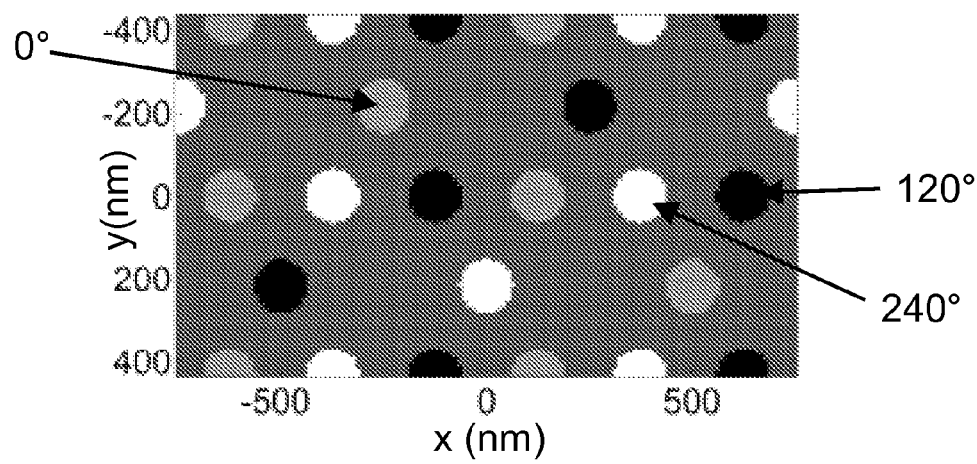
FIG. 25 shows a design of a honeycomb pattern of features in a 3-level phase-shift mask employed in a ninth embodiment.
Figure 26A:
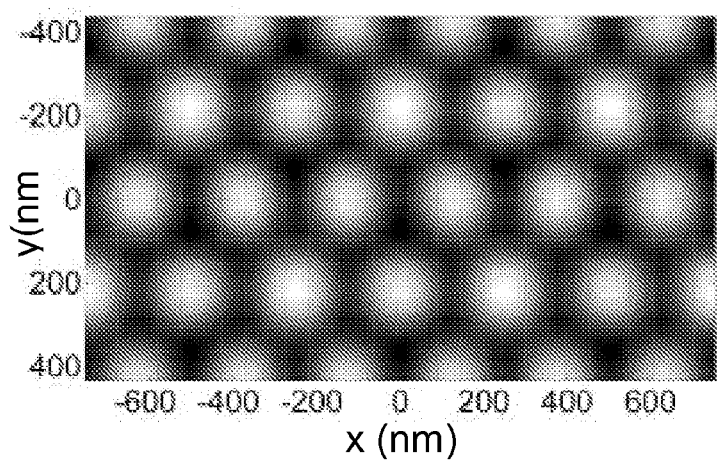
FIG. 26a shows the simulated average intensity distribution exposing the photoresist using the mask of the ninth embodiment and an ATL or DTL exposure
Figure 26B:
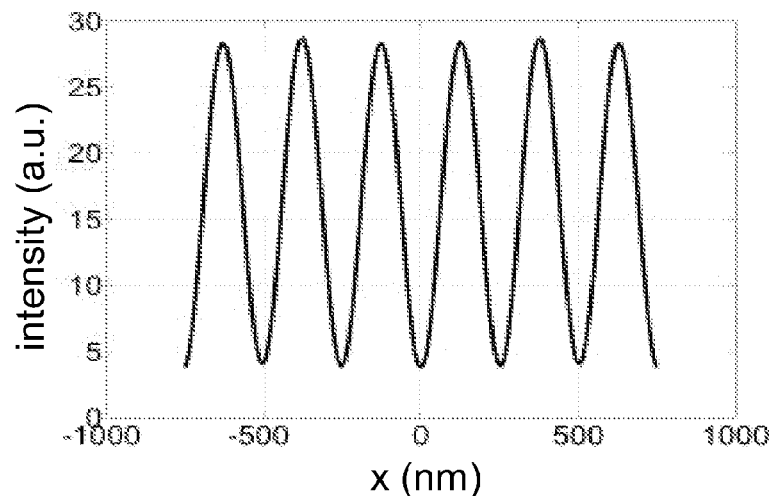

In a ninth embodiment of the present invention, with reference to FIG. 25, a composite pattern of features in a mask comprises an array of holes of diameter 130 nm arranged on a triangular-hexagonal honeycomb grid with a nearest-neighbour distance, a=250 nm, that has been formed in an opaque layer of chrome on a fused silica substrate (FIG. 25 only shows a repeating cell of the composite pattern). The pattern is composed of three overlapping and mutually offset sub-patterns of holes, the holes of each sub-pattern also being arranged on a triangular-hexagonal honeycomb grid but with a nearest-neighbour distance=$\sqrt{3}$a=433 nm. The surface of the fused silica substrate has been etched within the holes of the second and third sub-patterns to depths of 258 nm and 516 nm respectively. When this mask is introduced in the exposure system of FIG. 3 and illuminated in the same manner as in the first embodiment, the depths of the etched features in the second and third sub-patterns shifts the phase of the light transmitted by those sub-patterns by 120° and 240° respectively relative to the light transmitted by the first sub-pattern. Computer simulation of the average intensity distribution exposing the photoresist using this mask and the DTL technique yields a hexagonal array of intensity peaks with a nearest-neighbour distance of 250 nm, as illustrated in FIG. 26$a$. The variation of intensity in the x-direction across the centre of this distribution is depicted in FIG. 26$b$, showing the high-contrast of the intensity peaks. Close examination of the intensity peaks in this distribution reveals some variation of their intensities, with ~10% modulation, which is acceptable for certain applications.

Figure 27:
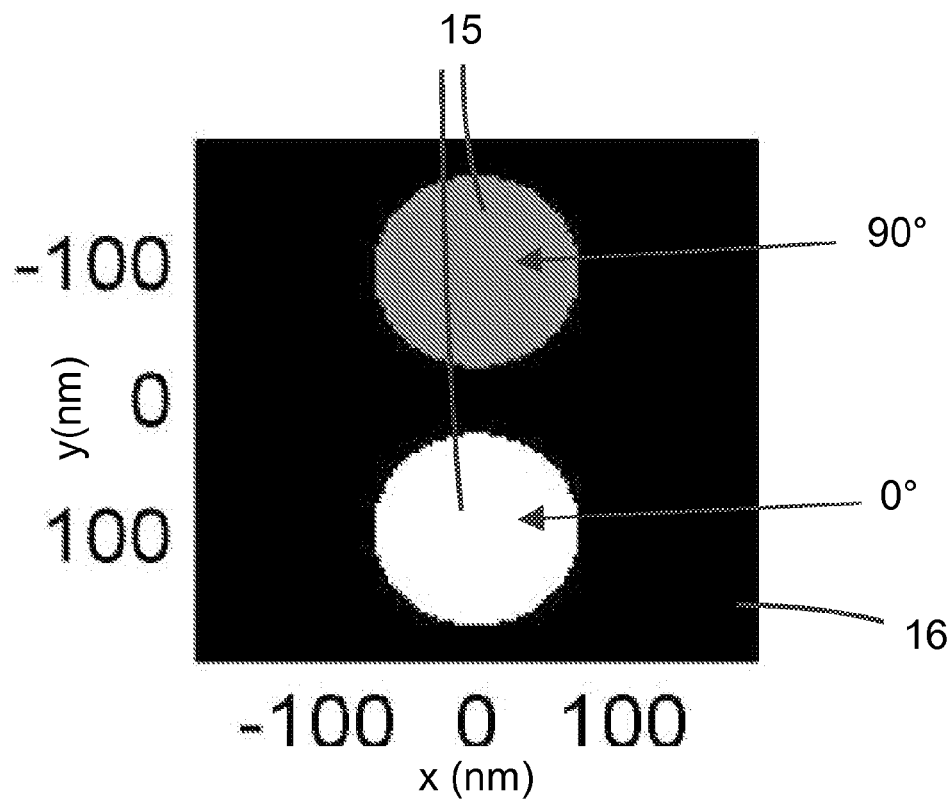
FIG. 27 illustrates the design of a pattern of features in a phase-shift mask employed in a tenth embodiment.
Figure 28:
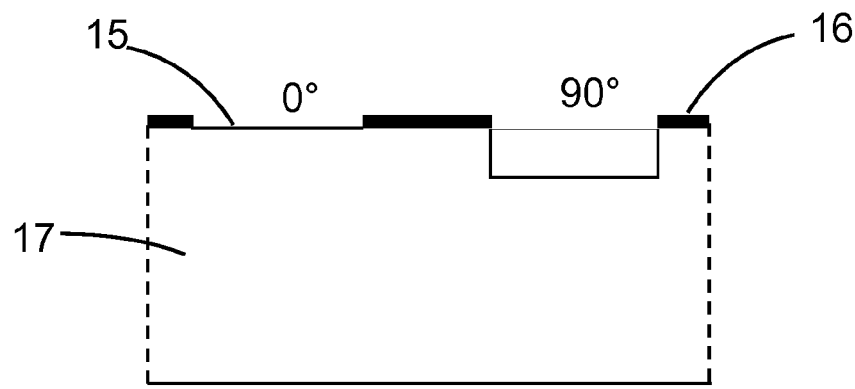
FIG. 28 shows the cross-section of the phase-shift mask of the tenth embodiment.
Figure 29A:
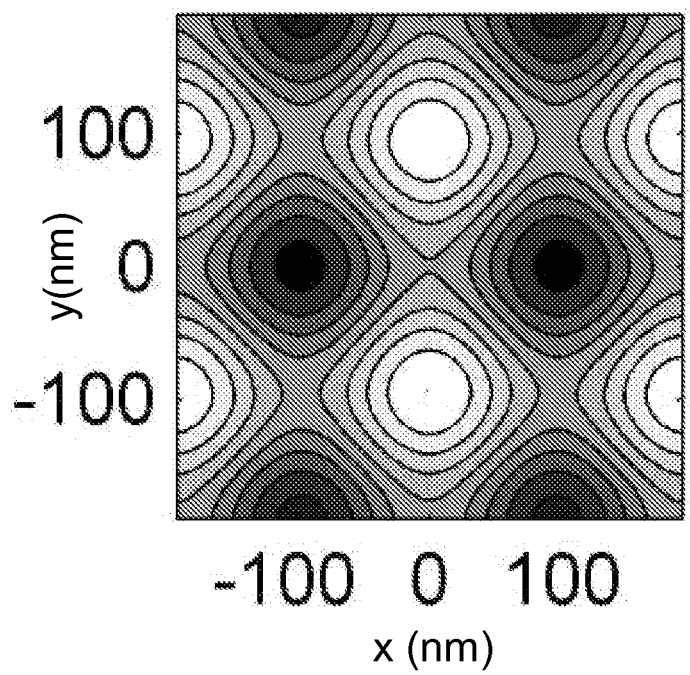
FIG. 29a shows the simulated average intensity distribution exposing the photoresist using the mask of the tenth embodiment and an ATL or DTL exposure.
Figure 29B:
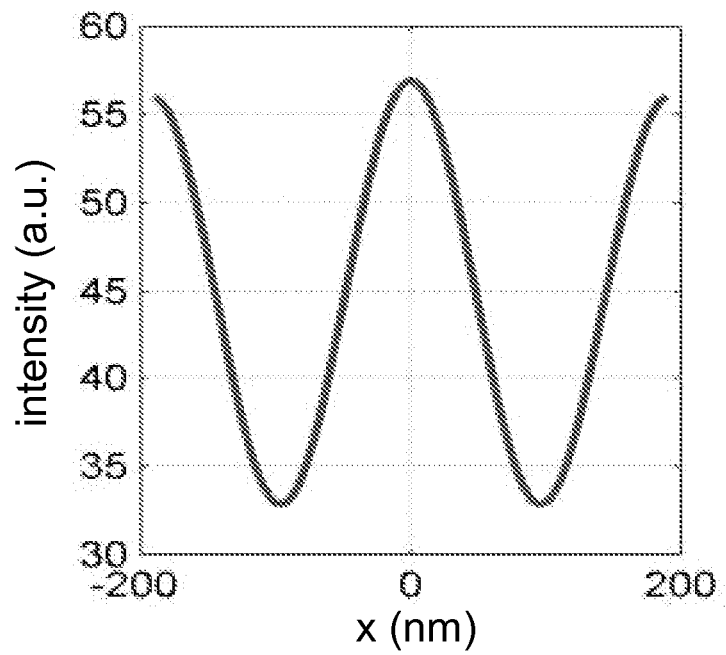

In a tenth embodiment of the present invention, with reference to FIGS. 27 and 28, a composite pattern in a mask comprises an array of holes 15 with diameter 140 nm arranged on a rectangular grid with nearest-neighbour distances (i.e. periods), $a_x$=380 nm and $a_y$=190 nm in the x and y directions respectively, that has been formed in an opaque layer of chrome 16 on a fused silica substrate 17. The pattern is composed of two overlapping and mutually offset sub-patterns of holes, the holes within both sub-patterns being arranged on a square grid with a nearest-neighbour distance (i.e. period), b=380 nm. FIG. 27 depicts a repeating cell of the composite pattern, which is repeated in a two-dimensional array of the repeating cells over a large area of the total mask pattern. The surface of the fused silica substrate within the holes of the second sub-pattern has been substantially uniformly etched to a depth of 194 nm, so that the resulting cross-sectional profile, in the y-direction, of the holes in the repeating cell is as shown in FIG. 28. With this hole depth, the phase of the light transmitted by the holes of the second sub-pattern is shifted 90° with respect to the light transmitted by the first sub-pattern. If the holes of the composite pattern were simply formed in a layer of chrome on a substrate without the different hole depths (i.e. according to the teaching of the prior art), then the light-field transmitted by the mask would only contain a 0th diffraction order and two 1st orders diffracted by the periodic component of the pattern in the x direction—the sub-wavelength period of the pattern in the y-direction would prevent light being diffracted in this plane; and so, would lead to a one-dimensional interference pattern at the photoresist without any intensity modulation in the y direction. Using the mask of FIG. 27 with the phase-shifting sub-pattern produces two additional diffraction orders in the y-plane that reconstruct two-dimensional Talbot images in planes separated by a Talbot distance. Exposing the photoresist-coated substrate 12 to this light-field using the DTL technique, using the apparatus of FIG. 3, by longitudinally displacing the substrate 12 with respect to the mask 5 during the exposure by a distance of at least the separation of the Talbot image planes, thus results in a periodic intensity distribution being printed into the photoresist layer 13. The average intensity distribution exposing the photoresist 13 is calculated to be a square array of intensity peaks with a nearest-neighbour distance (i.e. period) of 190 nm, as illustrated in FIG. 29$a$, signifying that the period of the pattern has been reduced by a factor 2 in the x direction with respect to that of the pattern in the mask, and is unchanged in the y direction. FIG. 29b depicts the intensity variation in the x-direction across the distribution of FIG. 29a at the y-coordinate of 95 nm, indicating the high contrast of the intensity distribution that is obtained and its suitability for a production photolithographic process. Clearly, if this intensity distribution were printed into a layer of positive photoresist then an array of holes would result, whereas if a negative photoresist were used then an array of posts would be printed. With an amplitude mask, it would not be possible to print this pattern using the DTL or ATL technique at this illumination wavelength, thus demonstrating a considerable advantage of the present invention for printing high-resolution periodic patterns of features arranged on a square grid.

Figure 30A:
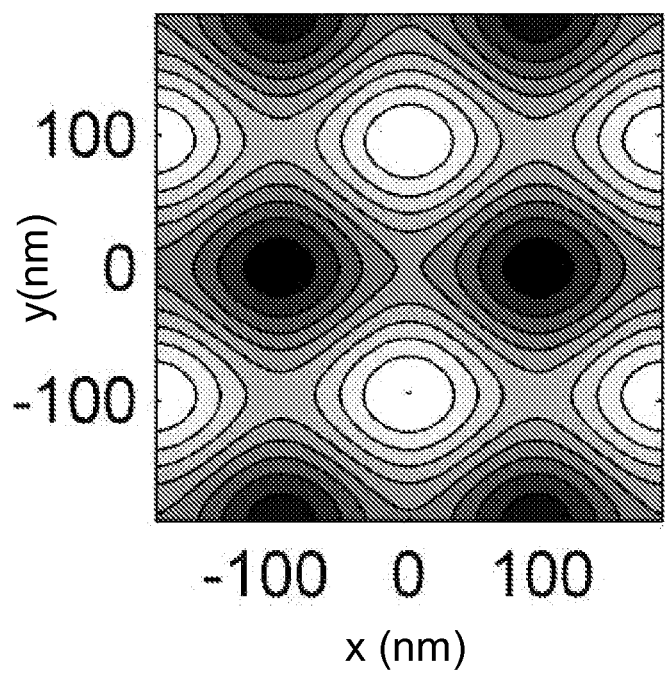
FIG. 30a shows the simulated average intensity distribution exposing the photoresist produced by a mask employed in the first embodiment whose phase-shift deviates from the design value.
Figure 30B:
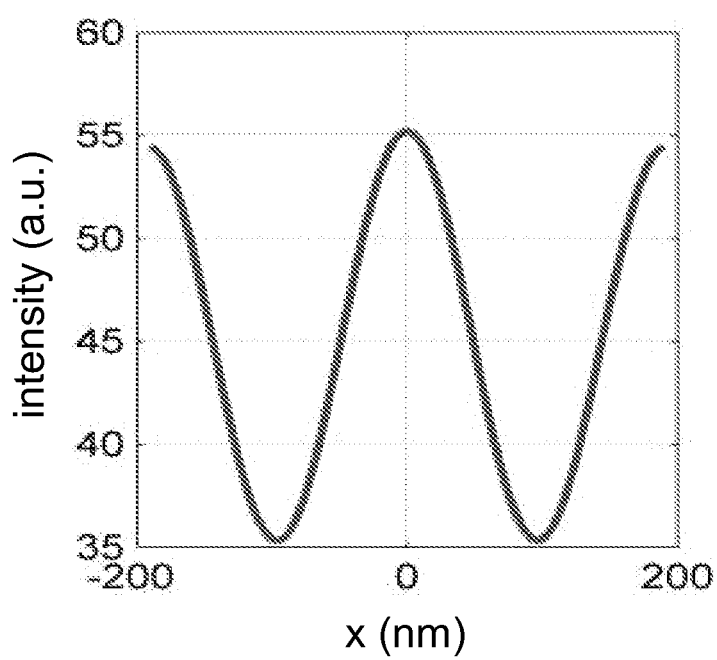

From additional computer simulations it is determined that deviations from 90° of the phase-shift produced by the second sub-pattern, as may occur in other embodiment of the invention, introduces some ellipticity into the cross-sectional shape of the intensity peaks. For example, if the holes of the second sub-pattern are slightly deeper so as to produce a phase-shift of 100°, then the average intensity distribution exposing the photoresist is calculated to be as shown in FIG. 30a, whose variation in the x-direction at the y-coordinate of 95 nm is depicted in FIG. 30b. Larger deviations of the phase shift result in progressively greater distortion of the intensity peaks such with a phase-shift of 150° the average intensity distribution exposing the photoresist corresponds substantially to a one-dimensional pattern of bright and dark parallel lines. From analysis of the dependence of the cross-sectional shape of the intensity peaks on the magnitude of the phase-shift, it is concluded that, in the case that a circular cross-section is required, the phase-shift should preferably be in the range 80° to 100°, and most preferably be in the range 85° to 95°, though depending on the lithographic requirements of the particular application, larger ranges may be tolerated.

Figure 31A:
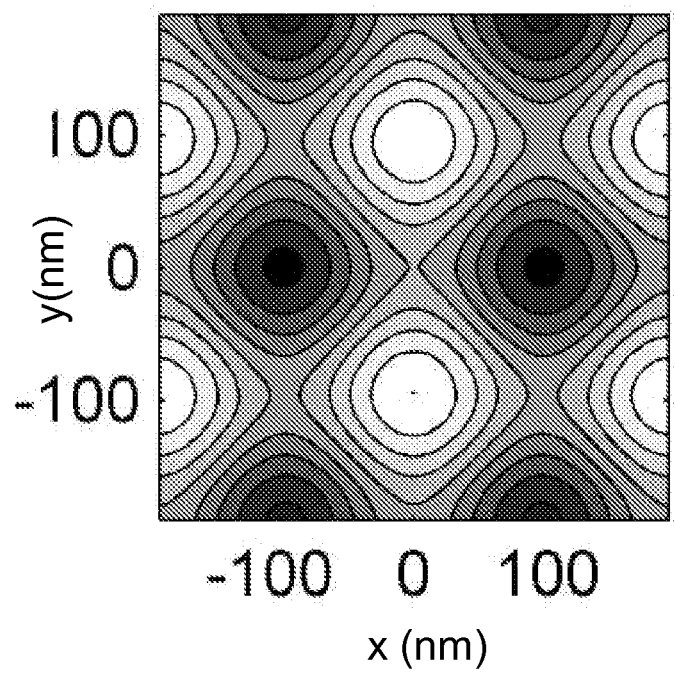
FIG. 31a shows the simulated average intensity distribution exposing the photoresist produced by the same design of mask employed in the first embodiment but with larger holes.
Figure 31B:
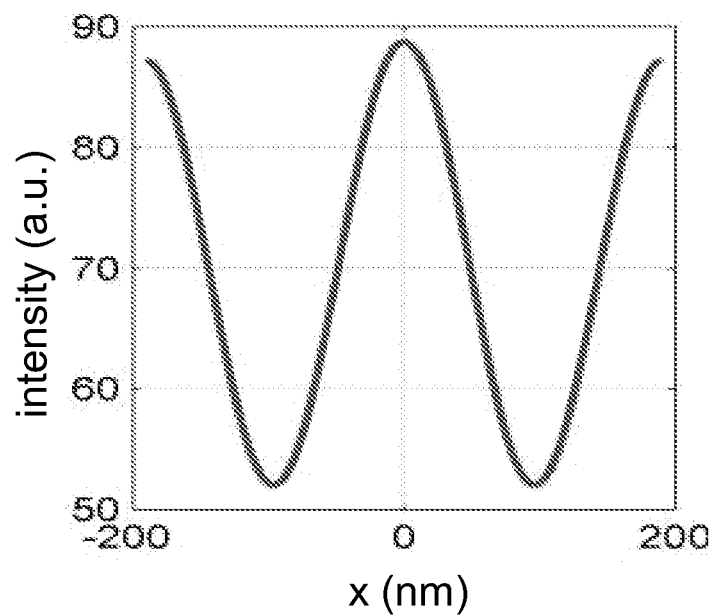

It is further determined from computer simulations that the cross-sectional shape of the peaks in the average intensity distribution obtained from the mask of this embodiment is substantially independent of the diameter of the holes in the mask (with all other design parameters remaining the same), and that the contrast of the peaks in the distribution is also substantially independent of the hole size. Thus, mask designs with other hole diameters may be alternatively employed with similar effect in other embodiments of the invention. For example, if the hole diameter in the design shown is instead 160 nm then the average intensity distribution exposing the photoresist is calculated to be as shown in FIG. 31a, whose variation in the x-direction at the y-coordinate of 95 nm is depicted in FIG. 31b. A larger hole diameter enables a greater transmission of light through the mask, which is advantageous for reducing the time required for printing the pattern into the photoresist.

Figure 32:
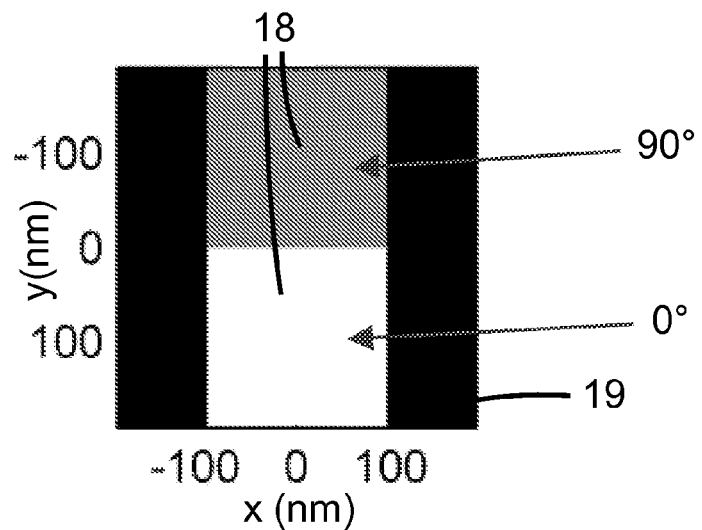
FIG. 32 illustrates the design of a phase-shift mask in another embodiment in which the transparent features are square instead of circular.
Figure 33A:
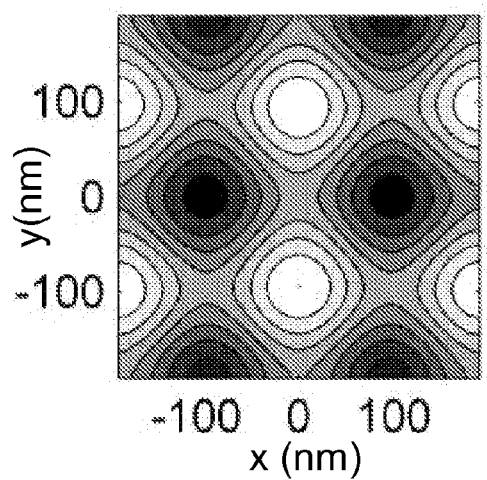
FIG. 33a shows the simulated average intensity distribution exposing the photoresist using the mask of FIG. 32 and an ATL or DTL exposure.
Figure 33B:
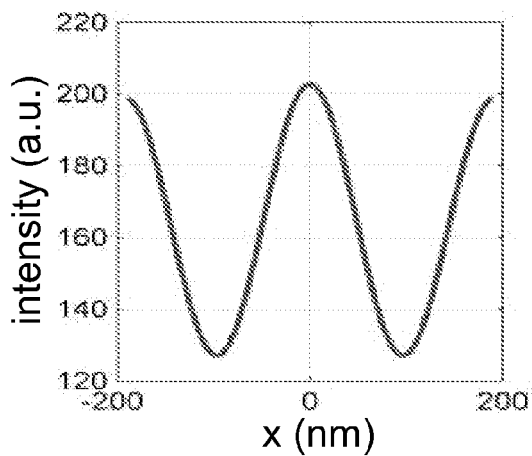

This increase in hole diameter may be extrapolated, in another embodiment of the invention, such that the cell design is as shown in FIG. 32, which comprises two transparent square regions, 18, bordered on each side by a chrome corridor 19. The surface of the substrate in the upper of the two square regions has been additionally etched so that the light propagating through that region is shifted in phase by 90° with respect to the light propagating through the lower of the two square regions. From computer simulations it is calculated that the average intensity distribution exposing the photoresist using this design of mask with either the DTL or ATL techniques is as shown in FIG. 33a, whose variation in the x direction at a y coordinate of 95 nm is depicted in FIG. 33b. As can be seen, the form and contrast of the resulting distribution is similar to that obtained using the masks of the previous embodiments with circular holes in the chrome layer. This design with large square areas though has higher transmission, so advantageously enables a higher intensity at the photoresist and therefore a shorter exposure. This design of mask, as for some of the previous designs, also advantageously allows the mask to be fabricated using only two lithography writing steps.

Figure 34:
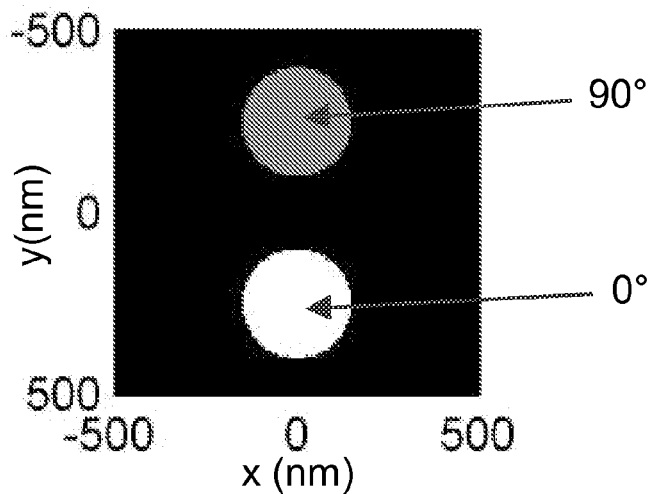
FIG. 34 illustrates the design of a phase-shift mask in another embodiment in which the period of the pattern is much larger.
Figure 35A:
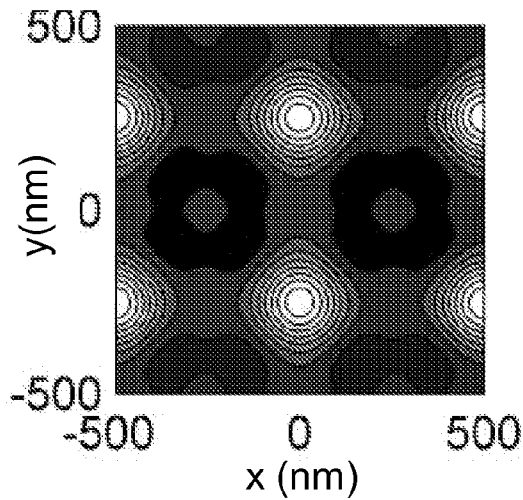
FIG. 35a shows the simulated average intensity distribution exposing the photoresist using the mask of FIG. 34 and an ATL or DTL exposure.
Figure 35B:
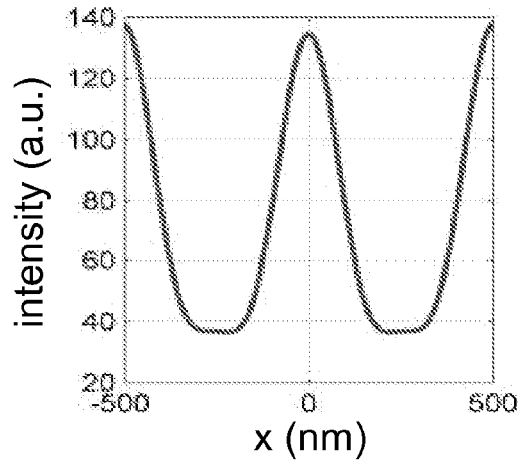

The smaller periods of square arrays of intensity peaks that may be printed using the present invention (in relation to the periods possible using amplitude masks, ATL or DTL according to the prior and the same illumination wavelength) are obtained when the periods of the holes in the composite mask pattern of FIG. 27 are in the ranges $\lambda<a_x<2\lambda$ and $\lambda/2<a_y<\lambda$, where $a_x=2a_y$. Whereas no such advantage of smaller period occurs when $p_x>2\lambda$ and $p_y>\lambda$, the present invention may also be applied to mask designs with such larger periods. FIG. 34 illustrates an example of such a design in which the composite pattern comprises an array of holes with diameter 300 nm arranged on a rectangular grid with nearest-neighbour distances (i.e. periods) of $a_x=1$ μm and $a_y=500$ nm are formed in a layer of chrome on a fused silica substrate; and is composed of two overlapping and mutually offset sub-patterns of holes arranged on a square grid each with a nearest-neighbour distance (i.e. period) of 1 μm. As in the first embodiment, the surface of the substrate has been etched within the holes of the second sub-pattern so that the phase of the light transmitted by the holes is shifted by 90° with respect to the light transmitted by the first sub-pattern. From computer simulation of the application of the DTL or ATL technique to this design of mask, it is calculated that the average intensity distribution exposing the photoresist is a square array of intensity peaks arranged on a square grid with period 500 nm, as is illustrated in FIG. 35a. The intensity variation in the x-direction across this distribution at the y-coordinate of 0 nm is depicted in FIG. 35b. The high contrast of the intensity peaks as well as the high uniformity and low intensity of the background illumination between the peaks demonstrate significant advantages of this embodiment of the present invention with respect to amplitude masks and DTL or ATL according to the prior art. The intensity peaks may be used either to print an array of holes into positive photoresist or to form an array of posts, or dots, in negative photoresist.

Whereas a particular exposure system based on the DTL technique has been employed in the above embodiments in order to clearly describe certain embodiments of the invention, it should be understood that this is only by way of example. Other DTL-based exposure systems using, for example, other illumination sources or other illumination wavelengths may be alternatively employed in other embodiments of the invention. Furthermore, in case of doubt, the different types of mask design disclosed above may be alternatively employed in above embodiments of the invention based instead on the ATL technique. In fact, the particular designs and simulation results presented in the above exemplary embodiments may be alternatively applied to an ATL exposure system whose illumination system is a mercury lamp providing a collimated beam of illumination with a spectral bandwidth centred on a wavelength of 365 nm. The separation of the substrate and mask during the exposure in such an embodiment should be arranged according to the period of the pattern in the mask and bandwidth of the light as taught in the prior art of ATL. The separation required may be determined from the diffraction angles of the light from the periodic pattern concerned, as may be calculated using the prior art. Other ATL-based exposure systems using, for example, other illumination sources and other illumination wavelengths with other spectral bandwidths may be employed in other embodiments of the invention. Clearly, in such different embodiments of the invention the design of the mask should take into account the illumination wavelength, the desired printed pattern and, preferably, the results of accurate computer simulations of the average intensity distribution exposing the photoresist using the ATL or DTL technique.

In other embodiments, AR coatings may be included above or below the photoresist layer to enhance the coupling efficiency of high-angular components of the light-field into the photoresist.

Whereas the embodiments above have been directed at employing the intensity peaks in the average intensity distributions produced by phase-shift masks using the DTL or ATL techniques, in other embodiments of the invention the intensity minima in the distributions may alternatively be used for printing the required periodic pattern of features, particularly when also employing a negative photoresist.

Whereas the hole features in the mask designs in the various embodiments above are circular, other shapes of feature, such as square or hexagon, may alternatively be employed in other embodiments of the invention.

Whereas a particular structure of mask materials and a particular strategy for mask fabrication are related above for realizing the different types of phase-shift masks designed and employed in the different embodiments of the present invention, it should be understood that other fabrication sequences and processes may be alternatively used in other embodiments of the invention that result in the same or equivalent phase-shifting and/or light transmitting structures. For example, the phase-shifting features may be formed instead in a layer or layers of a material deposited on the surface of the substrate, or formed in a layer that is over the opaque layer that defines the pattern of holes.

More generally, while the embodiments described above may be currently considered as preferred embodiments of the invention, it should, of course, be understood that various modifications and changes in form or detail could readily be made without departing from the spirit of the invention.

The invention claimed is:

1. A method of printing a desired two-dimensional periodic pattern of features having a first lattice symmetry and a first nearest-neighbor distance into a photosensitive layer, the method which comprises:
   a) providing a phase-shift mask bearing a mask pattern composed of at least two overlapping periodic sub-patterns of features each having a second lattice symmetry and a second nearest-neighbor distance, the features of each sub-pattern being formed in or on at least one transmissive material;
   b) providing a substrate with the photosensitive layer;
   c) arranging the mask substantially parallel to and with a separation from the substrate;
   d) providing substantially collimated light having a central wavelength and a spectral bandwidth for illuminating the mask pattern to generate a transmitted light-field in which light of the central wavelength forms a range of transversal intensity distributions between Talbot planes;
   e) illuminating the mask pattern with the light while maintaining the separation or changing the separation by a displacement distance to thereby expose the photosensitive layer to substantially an average of the range of transversal intensity distributions and printing the desired pattern;
   arranging the separation either according to the spectral bandwidth and the second nearest-neighbor distance and maintaining the separation during the illumination, or changing the separation during the illumination by a displacement distance that is related to the central wavelength and the second nearest-neighbor distance;
   forming the sub-patterns so that the light transmitted by each sub-pattern is shifted in phase relative to the light transmitted by at least one other sub-pattern;
   selecting the second nearest-neighbor distance in relation to the central wavelength so that first diffraction orders are formed in the transmitted light-field, and wherein the desired two-dimensional periodic pattern is printed using achromatic Talbot lithography (ATL) or displacement Talbot lithography (DTL) in which the mask is illuminated by the light.

2. The method according to claim 1, wherein the desired pattern is a periodic pattern of intensity peaks having a honeycomb first lattice symmetry and a first nearest-neighbor distance that is smaller than a central wavelength, wherein the mask pattern is composed of first, second and third sub-patterns each having a hexagonal second lattice symmetry and a second nearest-neighbor distance that is $\sqrt{3}$ times the first nearest-neighbor distance, and wherein the light transmitted by the second and third sub-patterns is shifted in phase by substantially 54° and 108° respectively relative to the light transmitted by the first sub-pattern.

3. The method according to claim 1, wherein the desired pattern is a periodic pattern of intensity peaks having a hexagonal first lattice symmetry, the mask pattern is composed of first, second and third sub-patterns each having a hexagonal second lattice symmetry and a second nearest-neighbor distance that is $\sqrt{3}$ times the first nearest-neighbor distance, and the light transmitted by the second and third sub-patterns is shifted in phase by substantially 120° and 240° respectively relative to the light transmitted by the first sub-pattern.

4. The method according to claim 1, wherein the desired pattern is a periodic pattern of intensity peaks having a hexagonal first lattice symmetry, the mask pattern is composed of first and second sub-patterns each having a honeycomb second lattice symmetry and a second nearest-neighbor distance that is $\sqrt{3}$ times the first nearest-neighbor distance, and wherein the light transmitted by the second sub-pattern is shifted in phase by substantially 60° relative to the light transmitted by the first sub-pattern.

5. The method according to claim 1, wherein the desired pattern is a periodic pattern of intensity peaks having a honeycomb first lattice symmetry, the mask pattern is composed of first and second sub-patterns each having a honeycomb second lattice symmetry and a second nearest-neighbor distance that is $\sqrt{3}$ times the first nearest-neighbor distance, and the light transmitted by the second sub-pattern is shifted in phase by substantially 180° relative to the light transmitted by the first sub-pattern.

6. The method according to claim 1, wherein the desired pattern is a periodic pattern of intensity peaks having a square first lattice symmetry, the mask pattern is composed of first, second, third and fourth sub-patterns each having a square second lattice symmetry and a second nearest-neighbor distance that is twice the first nearest-neighbor distance, and the light transmitted by the second, third and fourth sub-patterns is shifted in phase by substantially 90°, 180° and 270° respectively relative to the light transmitted by the first sub-pattern.

7. The method according to claim 1, wherein the desired pattern is a periodic pattern of intensity peaks having a square first lattice symmetry, the mask pattern is composed of first, second, third and fourth sub-patterns each having a square second lattice symmetry and a second nearest-neighbor distance that is twice the first nearest-neighbor distance, and the light transmitted by the second, third and fourth sub-patterns is shifted in phase by substantially 90°, 90° and 180° respectively relative to the light transmitted by the first sub-pattern.

8. The method according to claim 1, wherein the desired pattern is a periodic pattern comprising a mesh of continuous lines having a square first lattice, the mask pattern is composed of first, second, third and fourth sub-patterns each having a square second lattice symmetry and a second nearest-neighbor distance that corresponds to twice the first nearest-neighbor distance, and wherein the light transmitted by the second, third and fourth sub-patterns is shifted in phase by substantially 90°, 180° and 270° respectively relative to the light transmitted by the first sub-pattern.

9. The method according to claim 1, wherein the desired pattern is a periodic pattern of intensity peaks having a hexagonal first lattice symmetry, the mask pattern is composed of first, second and third sub-patterns each having a triangular-hexagonal honeycomb second lattice symmetry and a second nearest-neighbor distance that is √3 times the first nearest-neighbor distance, and the light transmitted by the second and third sub-patterns is shifted in phase by substantially 120° and 240° respectively relative to the light transmitted by the first sub-pattern.

10. The method according to claim 1, wherein the desired pattern is a periodic pattern of intensity peaks having a square first lattice symmetry, the mask pattern is composed of first and second sub-patterns each having a square second lattice symmetry and which are mutually offset such that the combined features of the first and second sub-patterns are arranged on a rectangular grid having an aspect ratio 2:1, the second nearest-neighbor distance corresponds to twice the first nearest-neighbor distance, and the light transmitted by the second sub-pattern is shifted in phase by substantially 90° relative to the light transmitted by the first sub-pattern.

11. The method according to claim 1, which comprises providing the sub-patterns with features additionally formed as openings in a layer of a substantially opaque material.

12. An apparatus for printing a desired two-dimensional periodic pattern of features having a first lattice symmetry and a first nearest-neighbor distance into a photosensitive layer, the apparatus comprising:

a) a phase-shift mask with a mask pattern composed of at least two overlapping periodic sub-patterns of features each having a second lattice symmetry and a second nearest-neighbor distance, the features of each said sub-pattern being formed in or on at least one transmissive material;
b) a substrate bearing the photosensitive layer;
c) means for arranging the mask substantially parallel to and with a separation from the substrate;
d) means for providing substantially collimated light having a central wavelength and a spectral bandwidth for illuminating the mask pattern to generate a transmitted light-field in which light of the central wavelength forms a range of transversal intensity distributions between Talbot planes;
e) means for illuminating said mask pattern with said light while maintaining the separation or changing the separation by a displacement distance, whereby the photosensitive layer is exposed to substantially an average of the range of transversal intensity distributions and the desired pattern is printed;
wherein the separation is either arranged according to the spectral bandwidth and the second nearest-neighbor distance and maintained during the illumination or is changed during the illumination by the displacement distance that is related to the central wavelength and the second nearest-neighbor distance, wherein the sub-patterns are formed so that the light transmitted by each sub-pattern is shifted in phase relative to the light transmitted by at least one other sub-pattern, and wherein the second nearest-neighbor distance is selected in relation to the central wavelength so that first diffraction orders are formed in the transmitted light-field, and wherein the desired two-dimensional periodic pattern is printed using achromatic Talbot lithography (ATL) or displacement Talbot lithography (DTL) in which said mask is illuminated by the light.

* * * * *